US009257482B2

(12) United States Patent  (10) Patent No.: US 9,257,482 B2
Rhee  (45) Date of Patent: Feb. 9, 2016

(54) DISPLAY DEVICE USING SEMICONDUCTOR LIGHT EMITTING DEVICE

(71) Applicant: LG ELECTRONICS INC., Seoul (KR)

(72) Inventor: Byungjoon Rhee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 14/510,905

(22) Filed: Oct. 9, 2014

(65) Prior Publication Data

US 2016/0005789 A1  Jan. 7, 2016

(30) Foreign Application Priority Data

Jul. 1, 2014 (KR) .......................... 10-2014-0082057

(51) Int. Cl.
| H01L 33/00 | (2010.01) |
| H01L 27/15 | (2006.01) |
| H01L 33/50 | (2010.01) |
| H01L 33/44 | (2010.01) |
| H01L 33/62 | (2010.01) |
| H01L 21/00 | (2006.01) |

(52) U.S. Cl.
CPC .......... *H01L 27/156* (2013.01); *H01L 33/0062* (2013.01); *H01L 33/44* (2013.01); *H01L 33/507* (2013.01); *H01L 33/62* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| 2007/0171148 A1* | 7/2007 | Cassidy ........................ 345/49 |
| 2007/0295952 A1* | 12/2007 | Jang et al. ..................... 257/15 |
| 2010/0084665 A1* | 4/2010 | Daniels et al. ................. 257/88 |
| 2010/0096646 A1 | 4/2010 | Jeong |
| 2011/0049537 A1 | 3/2011 | Lee et al. |
| 2012/0112162 A1* | 5/2012 | Shin .............................. 257/13 |
| 2013/0015454 A1* | 1/2013 | Park et al. ..................... 257/59 |
| 2014/0008665 A1 | 1/2014 | Jo et al. |
| 2014/0077252 A1 | 3/2014 | Lim et al. |

FOREIGN PATENT DOCUMENTS

| KR | 10-2010-0042987 A | 4/2010 |
| KR | 10-2010-0074853 A | 7/2010 |
| KR | 10-2014-0025055 A | 3/2014 |
| KR | 10-2014-0030887 A | 3/2014 |
| WO | WO 2014/038776 A1 | 3/2014 |

* cited by examiner

*Primary Examiner* — Calvin Choi
(74) *Attorney, Agent, or Firm* — Birch, Stewart, Kolasch & Birch, LLP

(57) ABSTRACT

Discussed is a display device using a semiconductor light emitting device. In a display device including a plurality of semiconductor light emitting devices, each of the plurality of semiconductor light emitting devices includes a first conductive semiconductor layer, a second conductive semiconductor layer overlapped with the first conductive semiconductor layer, an active layer disposed between the first conductive semiconductor layer and the second conductive semiconductor layer, a first electrode deposited on the first conductive semiconductor layer, and a second electrode deposited on the second conductive semiconductor layer, wherein the first electrode is extended toward an adjoining semiconductor light emitting device to be electrically connected to the adjoining semiconductor light emitting device.

23 Claims, 23 Drawing Sheets

(a)

(b)

(c)

DISPLAY DEVICE USING SEMICONDUCTOR LIGHT EMITTING DEVICE

CROSS-REFERENCE TO RELATED APPLICATIONS

Pursuant to 35 U.S.C. §119(a), this application claims the benefit of priority to Korean Application No. 10-2014-0082057, filed on Jul. 1, 2014 the contents of which is incorporated by reference herein in its entirety.

BACKGROUND OF THE INVENTION

1. Field of the Invention

The embodiments of the invention relate to a display device, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as mediocre response time, difficult implementation of flexibility in the instance of LCDs, and there exist drawbacks such as short life span, mediocre yield as well as low flexibility in the instance of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

Furthermore, in addition to this, it may be possible to conceive the structure of further simplifying a fabrication process in a flexible display using semiconductor light emitting devices.

SUMMARY OF THE INVENTION

An aspect of the embodiment of the invention is to provide a display device capable of further simplifying a fabrication process thereof as well as providing flexibility.

Another aspect of the embodiment of the invention is to provide a flip chip type semiconductor light emitting device with a new structure.

Still another aspect of the embodiment of the invention is to provide a semiconductor light emitting device capable of reducing a wiring process carried out on a supporting substrate.

In order to accomplish the foregoing task of the embodiment of the invention, there is provided a display device including a plurality of semiconductor light emitting devices according to the embodiment of the invention, wherein each of the plurality of semiconductor light emitting devices includes a first conductive semiconductor layer, a second conductive semiconductor layer overlapped with the first conductive semiconductor layer, an active layer disposed between the first conductive semiconductor layer and the second conductive semiconductor layer, a first electrode deposited on the first conductive semiconductor layer, and a second electrode deposited on the second conductive semiconductor layer, wherein the first electrode is extended toward an adjoining semiconductor light emitting device to be electrically connected to the adjoining semiconductor light emitting device.

According to an embodiment of the invention, the plurality of semiconductor light emitting devices may further include an insulating layer formed to cover the first electrode.

According to an embodiment of the invention, the insulating layer may include a black or white insulator.

According to an embodiment of the invention, the plurality of semiconductor light emitting devices may be disposed to form a light emitting device array, and first electrodes of the plurality of semiconductor light emitting devices may be connected to form a first electrode line extended along a column of the light emitting device array, and second electrodes of the plurality of semiconductor light emitting device may be connected to form a second electrode line extended in a direction crossed with the first electrode line.

According to an embodiment of the invention, the first electrode line and second electrode line may be electrically connected to a drive unit of the plurality of semiconductor light emitting devices.

According to an embodiment of the invention, an end portion of the first electrode line may be disposed adjacent to one side of the light emitting device array.

According to an embodiment of the invention, either one of the first electrode line and second electrode line may be formed in a bent shape such that an end portion of the second electrode is disposed adjacent to the one side of the light emitting device array.

According to an embodiment of the invention, the first electrode line may be covered by one surface of an insulating layer, and the second electrode line is formed to cover the other surface of the insulating layer.

According to an embodiment of the invention, the first electrode line may be disposed on one surface of the first conductive semiconductor layer.

According to an embodiment of the invention, an electrode pad may be disposed between the second electrode and the second conductive semiconductor layer.

According to an embodiment of the invention, at least one of the first and the second electrode may be a transparent electrode.

According to an embodiment of the invention, the plurality of semiconductor light emitting devices may be coupled to a supporting substrate through an adhesive layer.

According to an embodiment of the invention, the adhesive layer may be formed to fill out a space existing between the plurality of semiconductor light emitting devices.

According to an embodiment of the invention, the adhesive layer may be configured with a non-transparent layer to form a partition wall between the plurality of semiconductor light emitting devices.

According to an embodiment of the invention, black or white may be colored on the non-transparent layer.

According to an embodiment of the invention, a connecting line connected to at least one of the first electrode and second electrode, and extended toward a connection region provided on the supporting substrate may be formed on the supporting substrate.

According to an embodiment of the invention, the connection line may include a first connecting line connected to the first electrode and a second connecting line connected to the second electrode, a metal layer may have a first portion and a second portion of different thicknesses, and the first portion may be disposed between the first electrode and the first connecting line, and the second portion may be disposed between the second electrode and the second connecting line such that the first connecting line and the second connecting line are located on the same surface of the supporting substrate.

According to an embodiment of the invention, the supporting substrate may be formed of a flexible material.

According to an embodiment of the invention, the plurality of semiconductor light emitting devices may be disposed to form a plurality of light emitting device arrays, and a connecting portion for electrically connecting the adjoining light emitting device arrays to one another may be formed on the supporting substrate.

According to an embodiment of the invention, first electrodes of the plurality of semiconductor light emitting devices may form a first electrode line, second electrodes of the plurality of light emitting devices may form a second electrode line, and the second electrode line may be disposed on the supporting substrate.

According to an embodiment of the invention, each of the plurality of semiconductor light emitting devices may emit light of at least one of red light, green light, blue light and ultraviolet light.

According to an embodiment of the invention, a phosphor layer may convert a predetermined light into at least one of red light, green light and blue light.

A method of fabricating a display device according to the embodiment of the invention may include growing a first conductive semiconductor layer, an active layer and a second conductive semiconductor layer in a sequential manner on a substrate, etching the second conductive semiconductor layer and active layer to form a plurality of semiconductor light emitting devices on the substrate, forming a first electrode extended in one direction on the first conductive semiconductor layer to electrically connect the plurality of semiconductor light emitting devices, forming an insulating layer covering the plurality of semiconductor light emitting devices, and removing at least part of the insulating layer and then forming a second electrode electrically connected to the second conductive semiconductor layer.

According to an embodiment, an electrode pad may be disposed between the second conductive semiconductor layer and the second electrode, and the electrode pad may be formed during the step of forming the first electrode, and exposed to the outside by the removal of the insulating layer.

In a display device having a plurality of semiconductor light emitting devices according to an embodiment of invention, each of the plurality of semiconductor light emitting devices may include a first conductive semiconductor layer; a second conductive semiconductor layer overlapped with the first conductive semiconductor layer; an active layer disposed between the first conductive semiconductor layer and the second conductive semiconductor layer; a first electrode deposited on the first conductive semiconductor layer; a second electrode deposited on the second conductive semiconductor layer; and an insulating layer, wherein at least a portion of the insulating layer is disposed between the first electrode and the second electrode.

According to an embodiment of the invention, the insulating layer may cover the first electrode.

According to an embodiment of the invention, the insulating layer may cover a portion of the first conductive semiconductor layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Figure 1:
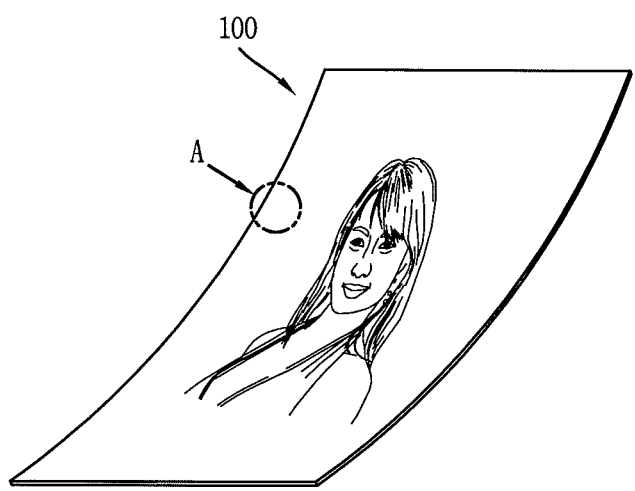
FIG. 1 is a conceptual view illustrating a display device using a semiconductor light emitting device according to an embodiment of the invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
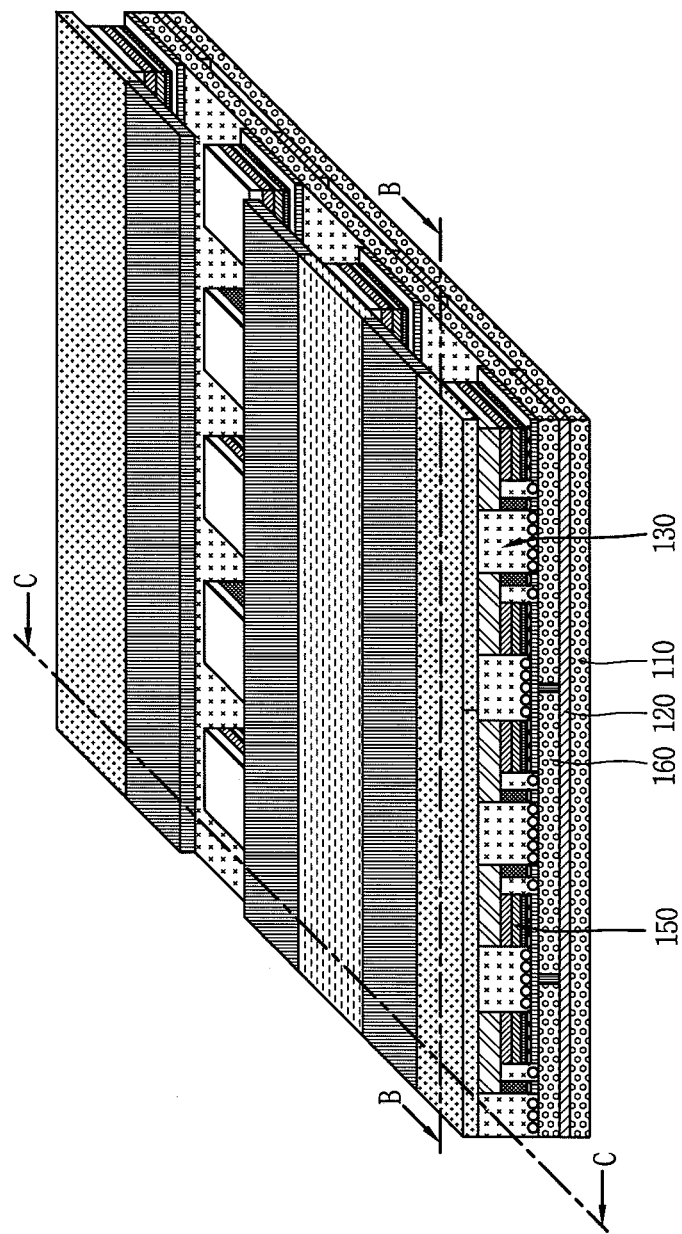
FIG. 2 is a partial enlarged view of portion "A" in FIG. 1.
Figure 3A:
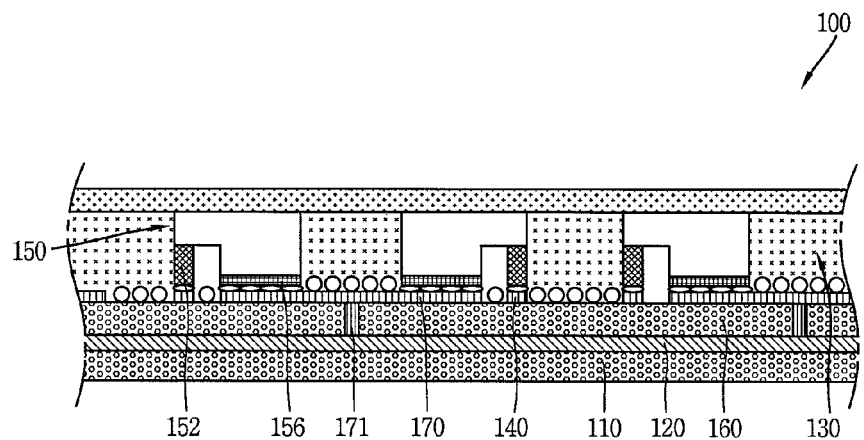
FIGS. 3A and 3B are cross-sectional views taken along lines B-B and C-C in FIG. 2.
Figure 3B:
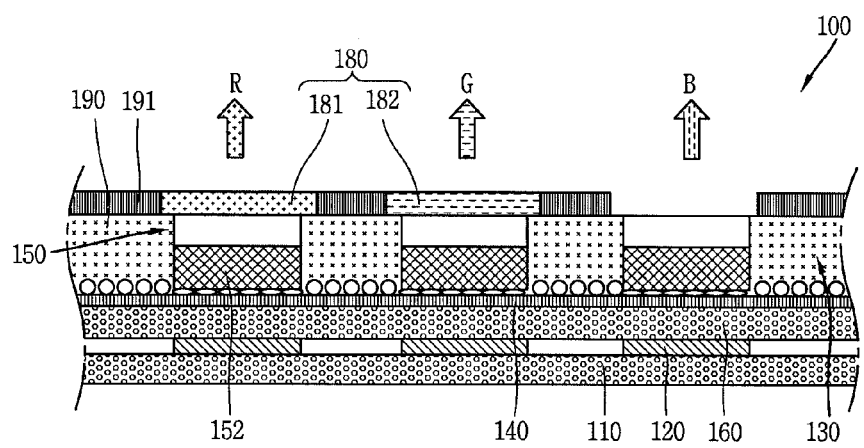
Figure 4:
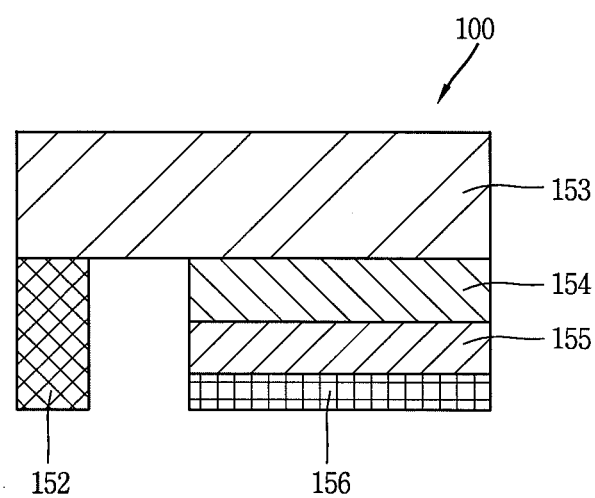
FIG. 4 is a conceptual view illustrating a flip-chip type semiconductor light emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiment of the invention may not be necessarily limited to this. For example, it may be possible to also have a structure in which a layer performing a specific function is formed between the insulating layer 160 and conductive adhesive layer 130, or the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the embodiment of the invention, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiment of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices are grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices

150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiment of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiment of the invention may not be necessarily limited to this, and another structure for implementing blue, red and green may be also applicable thereto.

Figure 5A:
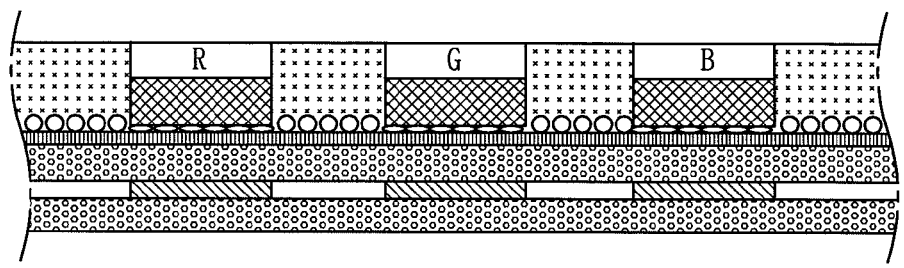
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
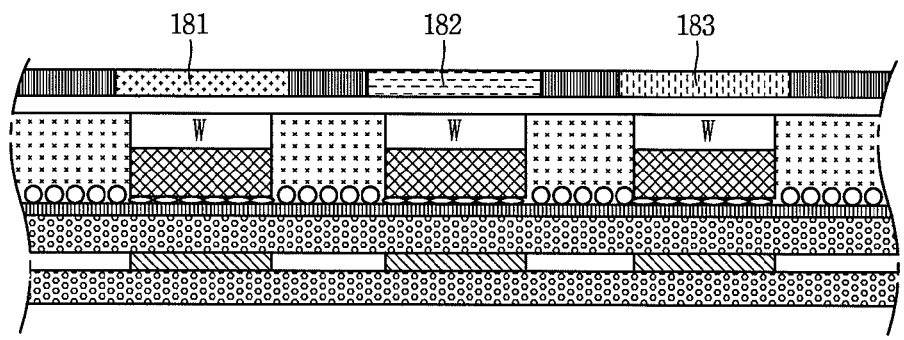

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
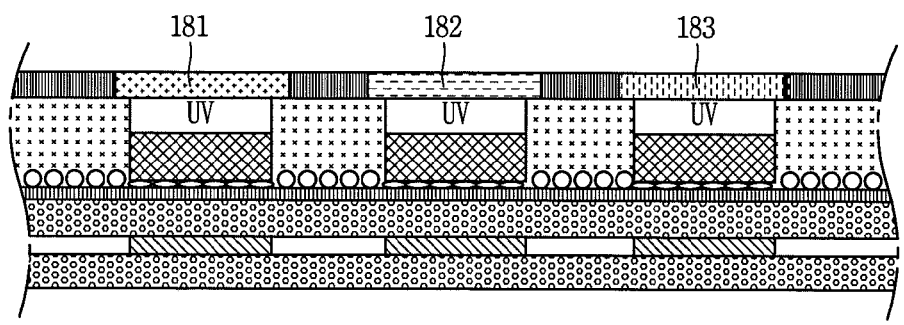

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the this example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In an instance of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, in an instance of a rectangular pixel in which one side of a sub-pixel is 600 μm in size, and the remaining one side thereof is 300 μm, a relative distance between the semiconductor light emitting devices becomes sufficiently large. Accordingly, in this instance, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
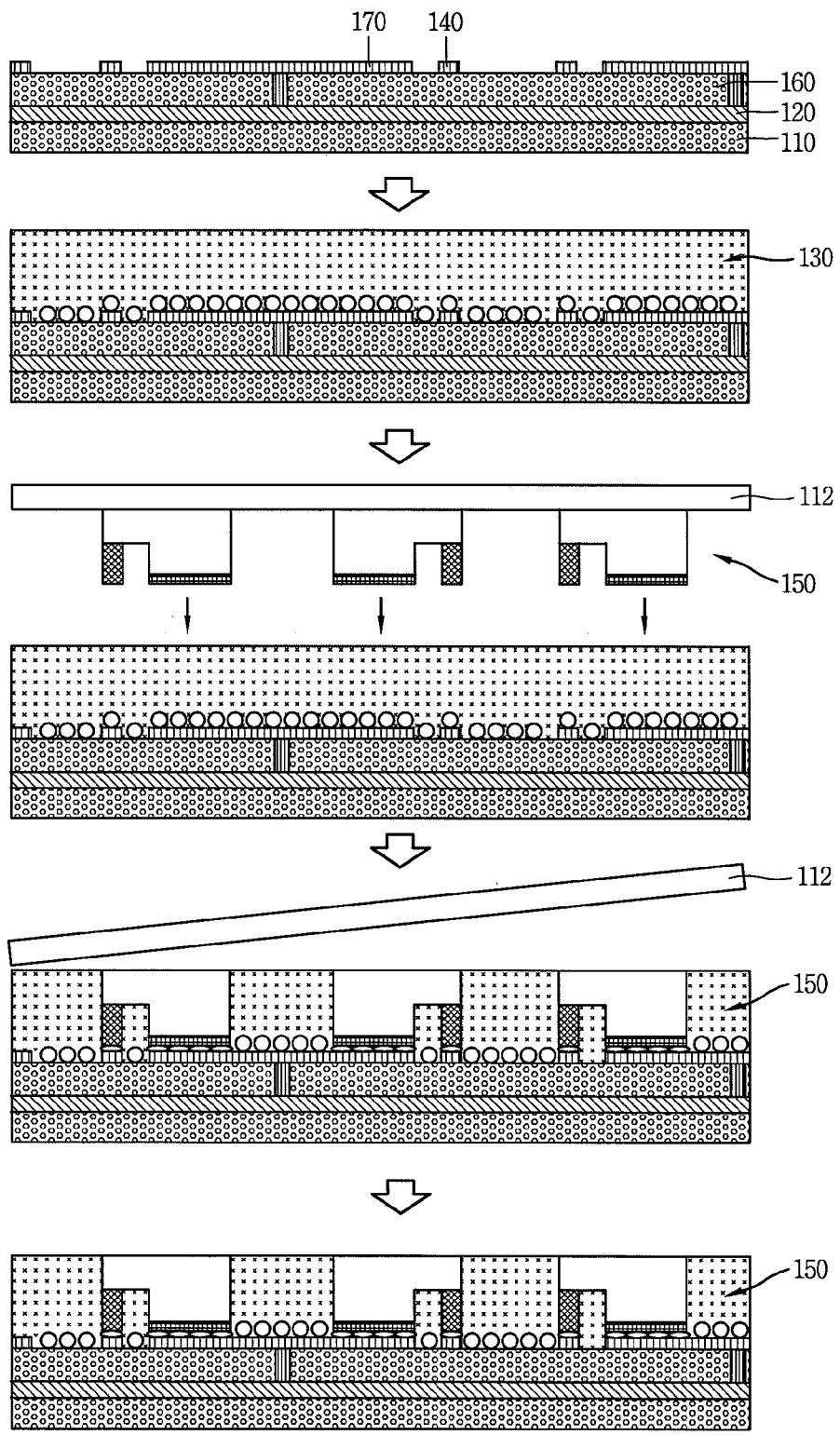
FIG. 6 is cross-sectional views illustrating a method of fabricating a display device using a semiconductor light emitting device according to the embodiment of the invention.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
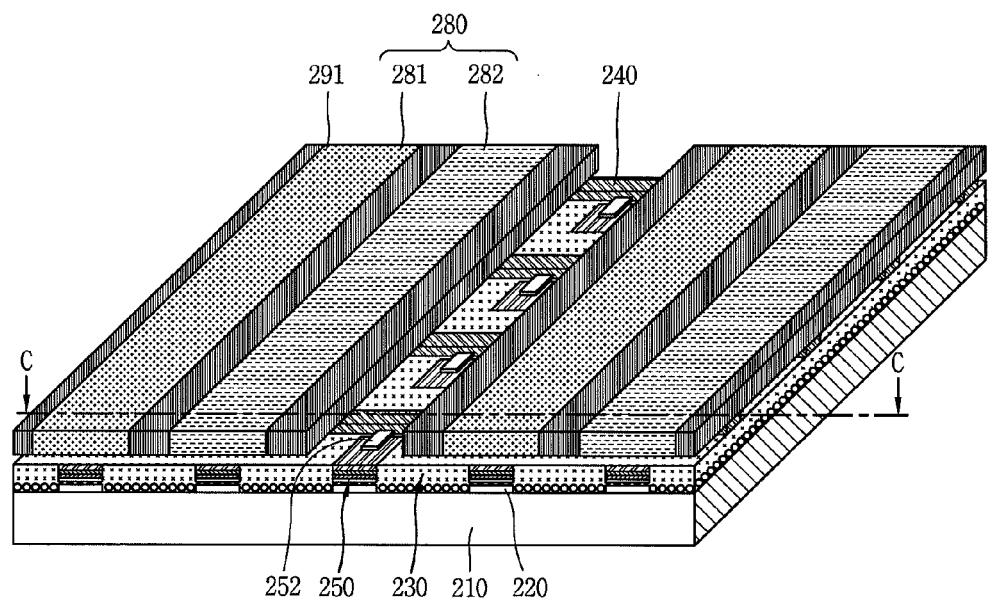
FIG. 7 is a perspective view illustrating a display device using a semiconductor light emitting device according to another embodiment of the embodiment of the invention.
Figure 8:
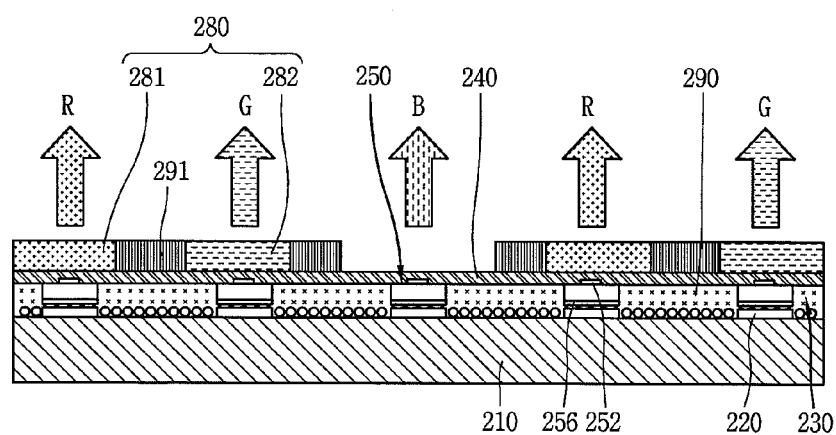
FIG. 8 is a cross-sectional view taken along line C-C in FIG. 7.
Figure 9:
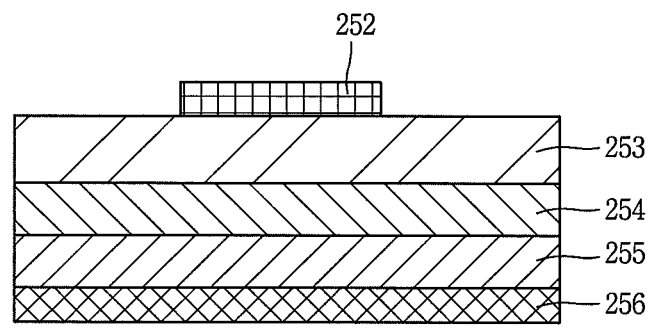
FIG. 9 is a conceptual view illustrating a vertical type semiconductor light emitting device in FIG. 8.

FIG. 7 is a perspective view illustrating a display device using a semiconductor light emitting device according to another embodiment of the embodiment of the invention. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the embodiment of the invention illustrates an instance where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 µm in the length of one side thereof, and formed with a rectangular or square shaped element. In an instance of a rectangular shaped element, the size thereof may be less than 20×80 µm.

The semiconductor light emitting device 250 may be a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the embodiment of the invention may not be necessarily limited to this, and another structure for implementing blue, red and green may be also applicable thereto as described above in a display device to which a flip chip type light emitting device is applied.

Taking the embodiment of the invention into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement a sub-pixel by means of the semiconductor light emitting device.

As described above with reference to FIG. 8, when the semiconductor light emitting device 250 is a blue semiconductor light emitting device 251 emitting blue (B) light, red and green may be implemented by the red phosphor 281 and green phosphor 282 constituting an individual pixel.

Furthermore, as described above with reference to FIGS. 2, 3A and 3B, even when the semiconductor light emitting device is a flip chip type blue semiconductor light emitting device, red and green may be implemented by the red phosphor 181 and green phosphor 182.

According to a display device using the foregoing semiconductor light emitting device according to the embodiment of the invention, it may be difficult to implement a fine pitch since a first and a second electrode are arranged on the same plane when a flip chip type is applied thereto, and it may have a problem in which an etching process and a vacuum process are accompanied therewith for electrode ohmic formation when a vertical type semiconductor light emitting device is applied thereto. According to the embodiment of the invention, there is proposed a flip chip type semiconductor light emitting device with a new form to solve the foregoing problem.

Figure 10A:
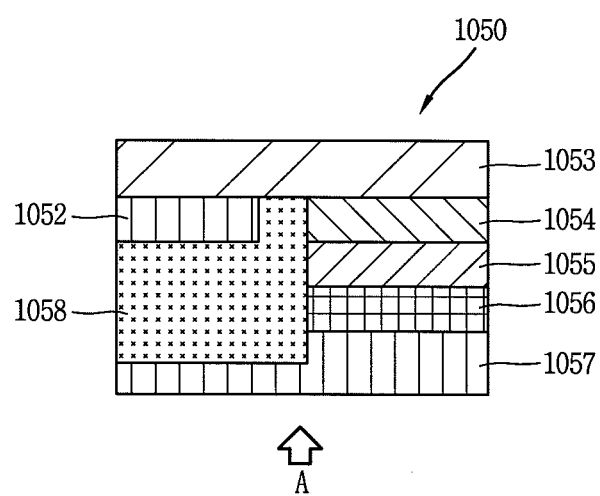
FIGS. 10A and 10B are conceptual views illustrating a semiconductor light emitting device with a new structure.
Figure 10B:
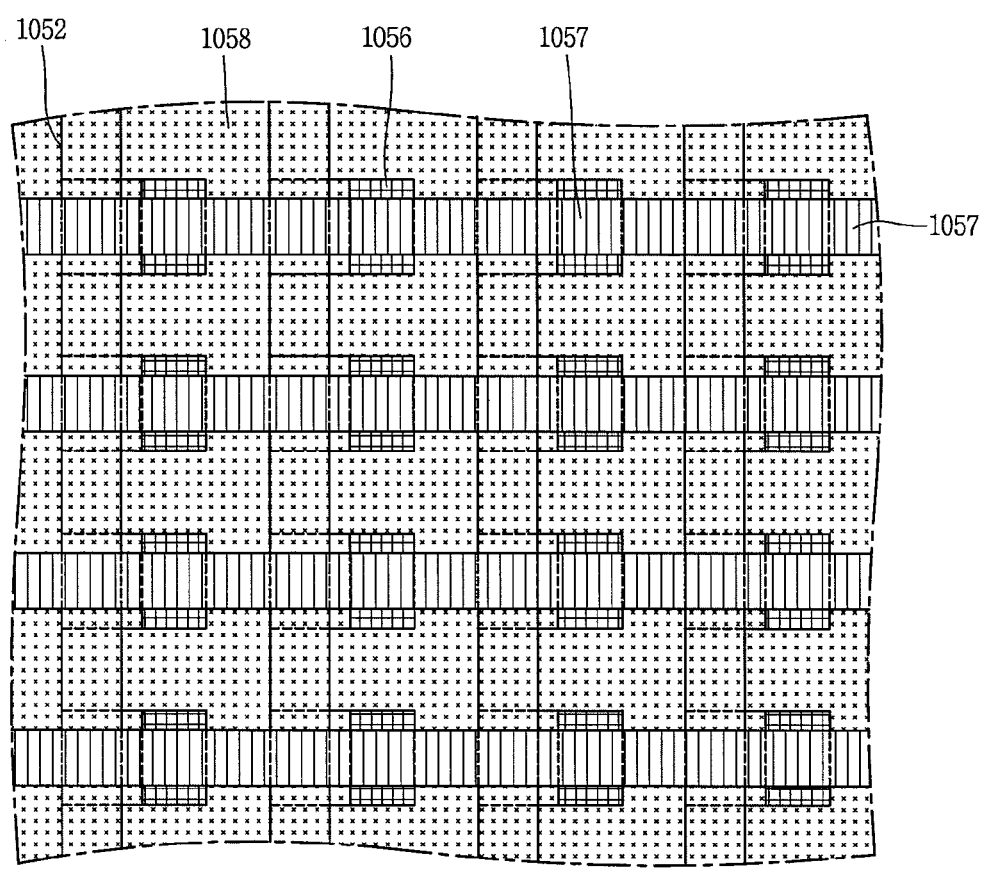

To this end, a semiconductor light emitting device with a new structure will be first described below. FIGS. 10A and 10B are conceptual views illustrating a semiconductor light emitting device with a new structure.

According to the embodiment of the invention, there is illustrated a display device 1000 using a passive matrix (PM) type semiconductor light emitting device. However, the following illustration may be also applicable to an active matrix (AM) type semiconductor light emitting device.

First, according to FIGS. 10A and 10B, a semiconductor light emitting device 1050 may be a flip chip type light emitting device, and the semiconductor light emitting device 1050 may include a first conductive semiconductor layer 1053, a second conductive semiconductor layer 1055 overlapped with the first conductive semiconductor layer 1053, a first electrode 1052 formed on the first conductive semiconductor layer and a second electrode 1057 deposited on the second conductive semiconductor layer 1055. Moreover, according to the drawing, the semiconductor light emitting device 1050 may include an active layer 1054 formed between the first conductive semiconductor layer 1053 and the second conductive semiconductor layer 1055. Furthermore, the semiconductor light emitting device 1050 may further include an electrode pad (or third electrode 1056) formed between the active layer 1054 and the second electrode 1057 and an insulating layer 1058 formed to cover the first electrode. Meanwhile, at least one of the first, the second and the electrode pad 1052, 1057, 1056 may be formed with a transparent electrode.

The first conductive semiconductor layer 1053 and the first electrode 1052 may be an "n-type semiconductor layer" and an "n-type electrode", respectively, and the second conductive semiconductor layer 1055 and the electrode pad (or third electrode 1056) may be a "p-type semiconductor layer" and a "p-type electrode", respectively.

More specifically, the first electrode 1052 and the active layer 1054 are formed on one surface of the first conductive semiconductor layer 1053, and disposed to be separated from each other by interposing the insulating layer 1058 therebetween. Here, one direction (horizontal direction) will be a width direction of the semiconductor light emitting device, and a vertical direction will be a thickness direction of the semiconductor light emitting device.

The second conductive semiconductor layer 1055 is formed on the other surface of the active layer 1054. The active layer 1054 has one surface and the other surface thereof, and said one surface is formed to face the first conductive semiconductor layer 1053, and the other surface is formed to face the second conductive semiconductor layer 1055.

Furthermore, an electrode pad 1056 is overlapped with one surface of the second conductive semiconductor layer 1055. According to this, the first conductive semiconductor layer 1053, active layer 1054, second conductive semiconductor layer 1055 and electrode pad 1056 constitute a layered structure.

As illustrated in the drawing, the first electrode 1052 and the electrode pad 1056 are formed to have a height difference in a thickness direction perpendicular to the one direction at positions separated from each other in said one direction, respectively.

Moreover, according to the drawing, at least part of the insulating layer 1058 is formed on the first conductive semiconductor layer 1053, and disposed between the first electrode 1052 and the active layer 1054. Furthermore, the insulating layer 1058 is formed to cover the first electrode 1052, and formed to be higher than a height from one surface of the first conductive semiconductor layer 1053 to a position deposited with the electrode pad 1056. As illustrated in the drawing, the insulating layer 1058 may be formed to have a step from the electrode pad 1056 in said one direction.

In this manner, the first electrode 1052 is covered by one surface of the insulating layer 1058, and the second electrode 1057 is formed to cover the other surface of the insulating layer 1058.

Moreover, the second electrode 1057 is formed to cover the insulating layer 1058 and the electrode pad 1056. Furthermore, the second electrode 1057 may be formed to cover an entire surface of the first conductive semiconductor layer 1053, and the first and the second electrode 1052, 1057 are overlapped with each other by interposing the insulating layer therebetween in a thickness direction perpendicular to said one direction. In this manner, the first and the second electrode 1052, 1057 are separated from each other by the insulating layer, and thus the n-type electrode and p-type electrode of the semiconductor light emitting device can be insulated from each other.

On the other hand, in a semiconductor light emitting device having the foregoing structure, the first electrode 1052 and second electrode 1057 are extended toward adjoining semiconductor light emitting devices to be electrically connected to the adjoining semiconductor light emitting devices.

More specifically, a plurality of semiconductor light emitting devices having the foregoing structure may form a light emitting device array. FIG. 10B is a conceptual view illustrating a semiconductor array formed by semiconductor light emitting devices having a new structure shown in FIG. 10A, which is a plan view in which the semiconductor array is seen in an "A" direction in FIG. 10A.

As illustrated in FIG. 10B, a plurality of semiconductor light emitting devices are disposed to form a light emitting device array, and the first electrode 1052 may be configured with a first electrode line to electrically connect the plurality of semiconductor light emitting devices disposed in a column direction. In this manner, a plurality of semiconductor light emitting devices disposed at each column of the light emitting device array share the first electrode 1052. In other words, the first electrode 1052 as an electrode formed on one surface of the first conductive semiconductor layer 1053 electrically connects a plurality of semiconductor light emitting devices included in the same column. In this manner, the first electrode 1052 connecting a plurality of semiconductor light emitting devices disposed along a column direction may perform the role of a scan electrode in the display device 1000 according to the embodiment of the invention. The first electrode 1052 may be an n-type electrode of the semiconductor light emitting device as well as a scan electrode of the display device 1000. In this manner, the display device 1000 according to the embodiment of the invention is allowed to electrically connect a plurality of semiconductor light emitting devices included in each column to a drive unit through the first electrode 1052, thereby reducing an additional wiring processes for forming a scan electrode in addition to a process for fabricating the semiconductor light emitting device.

Moreover, the second electrode 1057 formed on one surface of the electrode pad 1056 (or third electrode, p-type electrode) included in the foregoing semiconductor light emitting devices has a second electrode line extended in a row direction crossed with a column direction disposed with the first electrode 1052 (or first electrode line) in the semiconductor light emitting device array. As illustrated in the drawing, the second electrode 1057 electrically connects a plurality of light emitting devices included in each row.

In this manner, a plurality of semiconductor light emitting devices disposed at each row of the light emitting device array share the second electrode 1057. In other words, the second electrode 1057 as an electrode electrically connected to the second conductive semiconductor layer 1055 electrically connects a plurality of semiconductor light emitting device included in the same row. In this manner, the second electrode 1057 for electrically connecting a plurality of semiconductor light emitting device disposed along a row direction may perform the role of a data electrode in the display device 1000 according to the embodiment of the invention. In this manner, the display device 1000 according to the embodiment of the invention is allowed to electrically connect a plurality of semiconductor light emitting devices included in each row to a drive unit through the second electrode 1057, thereby reducing a wiring process for forming a data electrode in addition to a process for fabricating the semiconductor light emitting device.

On the other hand, a plurality of semiconductor light emitting devices forming a light emitting device array may be disposed to be separated from one another by interposing a predetermined space to adjoining light emitting devices, wherein the insulating layer 1058 may be filled between the semiconductor light emitting devices separately disposed therein. In other words, the insulating layer 1058 may be disposed between the semiconductor light emitting devices to perform the role of a partition wall. The insulating layer 1058 includes an insulator, and may be formed with the black insulator or white insulator. Moreover, the insulator may be formed of a resin, and the black or white insulator may be implemented by coloring the resin.

On the other hand, when the insulating layer 1058 is formed with a black insulator, the insulating layer 1058 may enhance the contrast of the semiconductor light emitting device as well as insulating the first and the second electrode 1052, 1057. Moreover, when the insulating layer 1058 is formed with a white insulator, the insulating layer 1058 performs the role of a reflector as well as insulating the first and the second electrode 1052.

As described above, a display device according to the embodiment of the invention may unify the fabrication process and wiring process of a light emitting device array.

Hereinafter, a method of fabricating a light emitting device array including a semiconductor light emitting device having a structure shown in FIGS. 10A and 10B will be described in more detail with reference to the accompanying drawings. FIGS. 11A, 11B, 12A and 12B are conceptual views for explaining a process of fabricating a semiconductor light emitting device shown in FIGS. 10A and 10B.

Figure 11A:
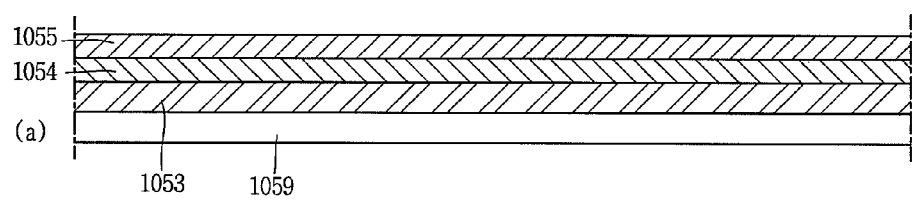
FIGS. 11A, 11B, 12A and 12B are conceptual views for explaining a process of fabricating a semiconductor light emitting device shown in FIGS. 10A and 10B.
Figure 11A:
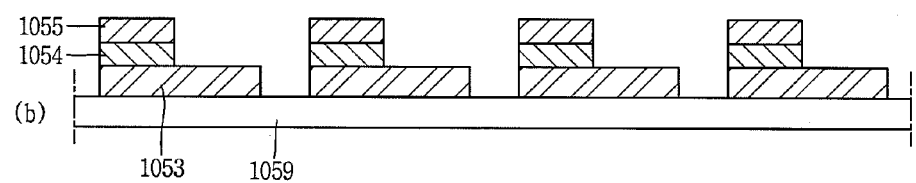
Figure 11A:
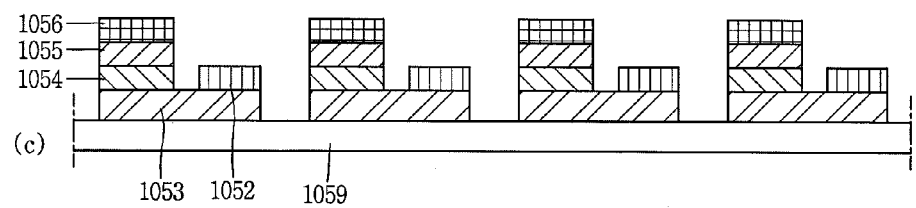

First, according to the fabrication method, a first conductive semiconductor layer 1053, an active layer 1054 and a second conductive semiconductor layer 1055, respectively, are grown on a growth substrate 1059 ((a) of FIG. 11A).

If the first conductive semiconductor layer 1053 is grown, then the active layer 1054 is grown on the first conductive semiconductor layer 1053, and then the second conductive semiconductor layer 1055 is grown on the active layer 1054. In this manner, when the first conductive semiconductor layer 1053, active layer 1054 and second conductive semiconductor layer 1055 are sequentially grown, the first conductive semiconductor layer 1053, active layer 1054 and second conductive semiconductor layer 1055 form a layered structure as illustrated in (a) of FIG. 11A.

The growth substrate 1059 (wafer) may be formed of any one of materials having light transmission characteristics, for example, sapphire ($Al_2O_3$) GaN, ZnO and AlO, but may not be necessarily limited to this. Furthermore, the growth substrate 1059 may be formed of a material suitable to semiconductor material growth, carrier wafer. The growth substrate 1059 may be formed of a material having an excellent thermal conductivity, and thus an SiC substrate having a thermal conductivity greater than that of the sapphire ($Al_2O_3$) substrate or at least one of Si, GaAs, GaP, InP and $Ga_2O_3$, including a conductive substrate or insulating substrate, may be used.

Next, at least part of the active layer 1054 and second conductive semiconductor layer 1055 is removed to expose at least part of the first conductive semiconductor layer 1053 ((b) of FIG. 11A).

In this instance, part of the active layer 1054 and second conductive semiconductor layer 1055 is removed in a vertical direction to expose the first conductive semiconductor layer 1053 to the outside.

Figure 12A:
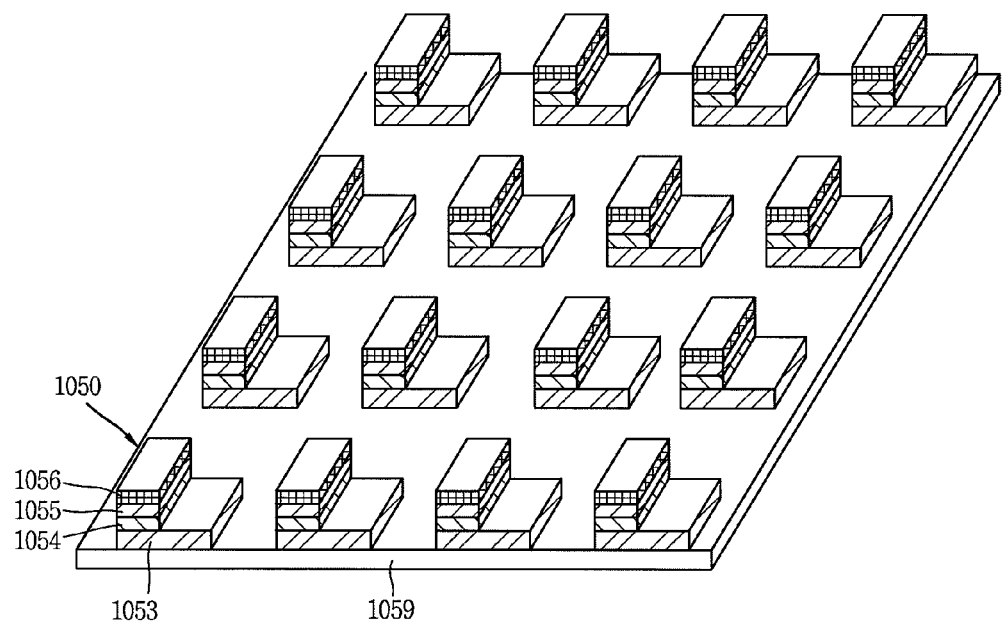

Moreover, an isolation is carried out as illustrated in (b) of FIGS. 11A and 12A such that a plurality of light emitting devices formed through the foregoing method form a light emitting device array. In other words, the second conductive semiconductor layer 1055 and active layer 1054 are etched to form a plurality of semiconductor light emitting devices.

Figure 12B:
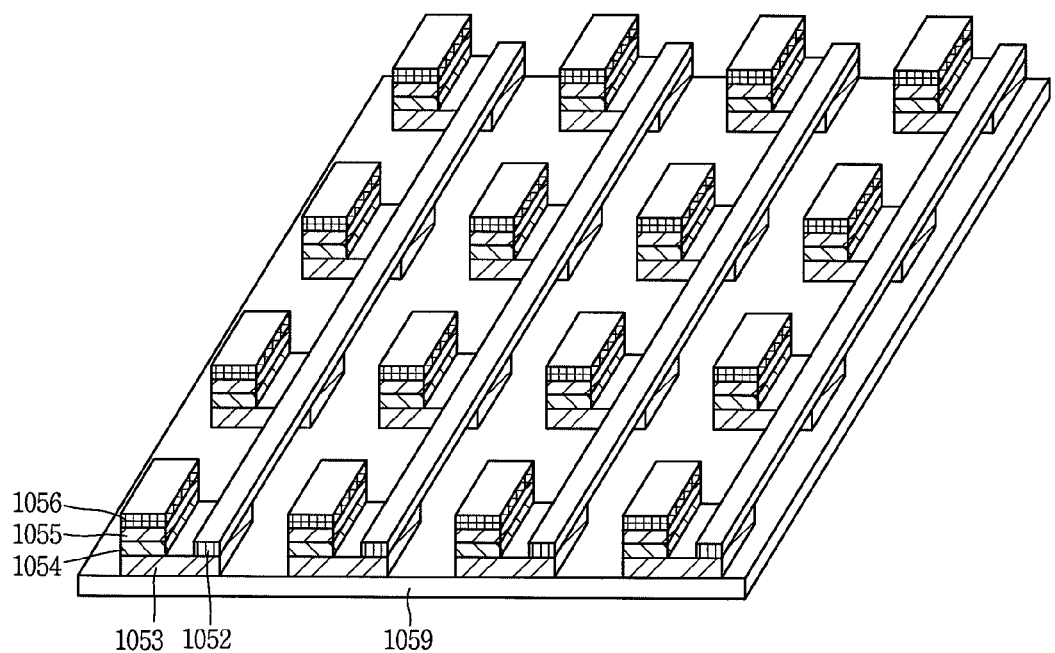

Next, the first electrode 1052 and electrode pad (or third electrode or p-type electrode 1056) having a height difference in a thickness direction are formed on the first conductive semiconductor layer 1053 and the second conductive semiconductor layer 1055, respectively, to implement a flip chip type light emitting device ((c) of FIG. 11A). Here, the first electrode 1052 is formed with an electrode line to electrically connect a plurality of semiconductor light emitting devices disposed along one direction (for example, a column direction) of the light emitting device array as illustrated in FIG. 12B. Through this, a plurality of semiconductor light emitting devices disposed at each column of the light emitting device array may share the first electrode 1052. The first electrode may be configured to be extended from any one semiconductor light emitting device to at least one of the other semiconductor light emitting devices adjacent thereto to electrically connect the plurality of semiconductor light emitting devices adjacent to one another along the column.

In this manner, the first electrode 1052 for electrically connecting a plurality of semiconductor light emitting devices disposed along a column direction may perform the role of a scan electrode in the display device 1000 according to the embodiment of the invention.

In other words, the first electrode 1052 is an n-type electrode of the semiconductor light emitting device as well as a scan electrode of the display device 1000. In this manner, in the display device 1000 according to the embodiment of the invention, a plurality of semiconductor light emitting devices included in each column and a drive unit can be electrically connected to each other through the first electrode 1052, thereby reducing a wiring processes for forming a scan electrode in addition to a process for fabricating the semiconductor light emitting device. Here, the first electrode 1052 may be formed with a transparent electrode. Meanwhile, the electrode pad or p-type electrode 1056 may form a dot electrode.

The first electrode 1052 and third electrode 1056 may be formed with a deposition method such as sputtering or the like, but the embodiment of the invention may not be necessarily limited to this.

As illustrated in the drawing, the first electrode 1052 and third electrode (or electrode pad, p-type electrode 1056) are configured to have a height difference in a direction perpendicular to one direction at positions separated from each other in said one direction. Here, said one direction will be a width direction of the semiconductor light emitting device, and a vertical direction will be a thickness direction of the semiconductor light emitting device.

Figure 11B:
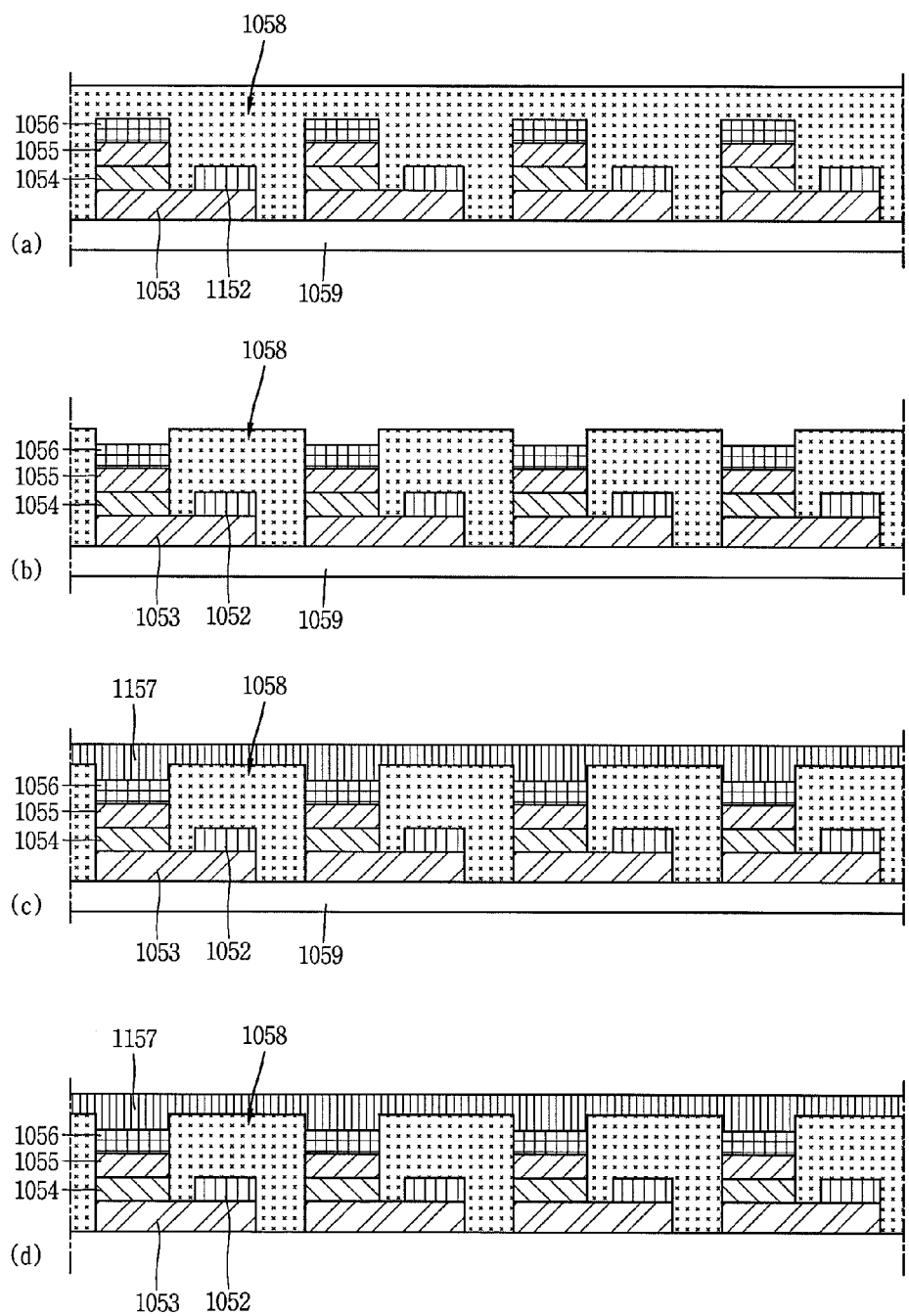

In a state that the first electrode 1052 and third electrode (or electrode pad, p-type electrode 1056) are formed thereon, an insulator is coated to form the insulating layer 1058 ((a) of FIG. 11B). As illustrated in the drawing, the first electrode 1052 and the active layer 1054 are formed on one surface of the first conductive semiconductor layer 1053, and disposed to be separated from each other by interposing the insulating layer 1058 therebetween. Here, one direction (horizontal direction) will be a width direction of the semiconductor light emitting device, and a vertical direction will be a thickness direction of the semiconductor light emitting device.

A plurality of semiconductor light emitting devices forming a light emitting device array may be disposed to be separated from one another by interposing a predetermined space to adjoining light emitting devices, and as illustrated in the drawing, the insulating layer 1058 may be filled between the semiconductor light emitting devices separately disposed therein. In other words, the insulating layer 1058 may be disposed between the semiconductor light emitting devices to perform the role of a partition wall. In this manner, the first electrode 1052 is covered by one surface of the insulating layer 1058. Meanwhile, as illustrated in the drawing, a plurality of semiconductor light emitting devices forming a light emitting device array may be disposed to be separated from one another by interposing a predetermined space to adjoining light emitting devices, wherein the insulating layer 1058 is filled between the semiconductor light emitting devices separately disposed therein. In other words, the insulating layer 1058 may be disposed between the semiconductor light emitting devices to perform the role of a partition wall.

Here, the insulating layer 1058 may be coated to cover all the semiconductor light emitting devices formed on the growth substrate 1059. An insulator constituting the insulating layer 1058 may be a resin having a specific color. The insulating layer 1058 may be formed with an insulator having a black or white color, and the black or white insulator may be implemented by coloring the resin.

On the other hand, when the insulating layer 1058 is formed with a black insulator, the insulating layer 1058 may enhance the contrast of the semiconductor light emitting device. Moreover, when the insulating layer 1058 is formed with a white insulator, the insulating layer 1058 may perform the role of a reflector as well as insulating the first and the second electrode 1052.

Next, at least part of the insulating layer is etched to expose the electrode pad (or third electrode or p-type electrode 1056) ((b) of FIG. 11B). Subsequent to removing at least part of the insulating layer 1058, the second electrode 1057 electrically connected to the electrode pad is formed ((c) of FIG. 11B). The second electrode 1057 is formed on one surface of the electrode pad 1056 (or third electrode, p-type electrode), and configured with an electrode line extended in a row direction crossed with a column direction disposed with the first electrode 1052 (or first electrode line) in the light emitting device array. As illustrated in the drawing, the second electrode 1057 electrically connects a plurality of light emitting devices included in each row.

A plurality of semiconductor light emitting devices disposed at each row of the light emitting device array share the second electrode 1057. In other words, the second electrode 1057 as an electrode electrically connected to the second conductive semiconductor layer 1055 electrically connects a plurality of semiconductor light emitting device included in the same row. In this manner, the second electrode 1057 electrically connecting a plurality of semiconductor light emitting devices disposed along a row direction may perform the role of a data electrode in the display device 1000 according to the embodiment of the invention.

On the other hand, the second electrode 1057 is formed to cover the insulating layer 1058 and the electrode pad 1056, and the first and the second electrode 1052, 1057 are overlapped with each other by interposing the insulating layer therebetween in a thickness direction perpendicular to said one direction. In this manner, the first and the second electrode 1052, 1057 are separated from each other by the insulating layer, and thus the n-type electrode and p-type electrode of the semiconductor light emitting device can be insulated from each other.

As described above, the electrode pad (or third electrode or p-type electrode 1056) is disclosed between the second electrode 1057 and the second conductive semiconductor layer 1055. However, it is possible that there is no the electrode pad 1056 between the second electrode 1057 and the second conductive semiconductor layer 1055. In this instance, the second electrode 1057 is located at a surface of the second conductive semiconductor layer 1055, and the sputtering of the electrode pad 1056 may be omitted from the process of fabricating the semiconductor light emitting device. Furthermore, at least part of the insulating layer may be etched to expose the second conductive semiconductor layer 1055 rather than the electrode pad (or third electrode or p-type electrode 1056) in the process of fabricating the semiconductor light emitting device.

The display device 1000 according to the embodiment of the invention is allowed to electrically connect a plurality of semiconductor light emitting devices included in each row to a drive unit through the second electrode 1057, thereby reducing a wiring process for forming a data electrode in addition to a process for fabricating the semiconductor light emitting device.

Finally, as illustrated in (d) of FIG. 11B, when the growth substrate 1059 is removed, a semiconductor light emitting device array is formed thereon.

Figure 13:
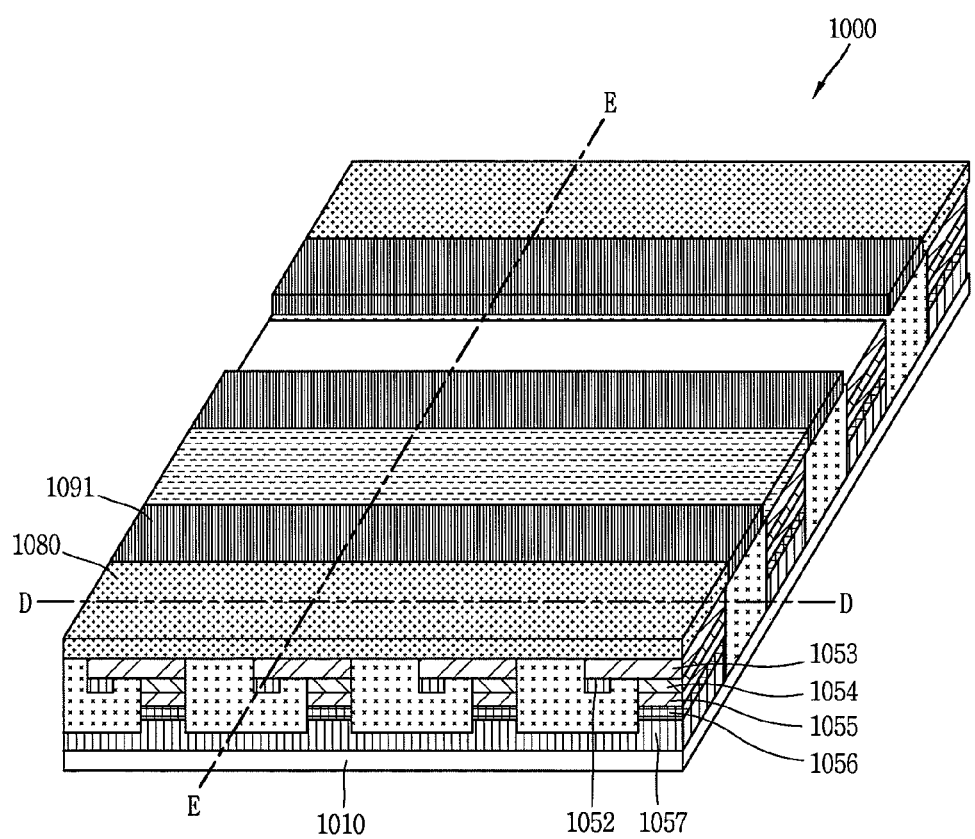
FIG. 13 is a partially enlarged view illustrating a display device to which a semiconductor light emitting device with a new structure is applied.

In this manner, semiconductor light emitting devices from which the growth substrate 1059 is removed may be adhered on the supporting substrate 1010 as illustrated in FIG. 13. Meanwhile, an adhesive layer may be further formed between the semiconductor light emitting devices 1050 and the supporting substrate 1010.

Hereinafter, a display device including a plurality of semiconductor light emitting devices formed through the foregoing fabrication method will be described in more detail with reference to the accompanying drawings. FIG. 13 is a partially enlarged view illustrating a display device to which a semiconductor light emitting device with a new structure is applied, and FIG. 14A is a cross-sectional view taken along line D-D in FIG. 13, and FIG. 14B is a cross-sectional view taken along line E-E in FIG. 13.

Figure 14A:
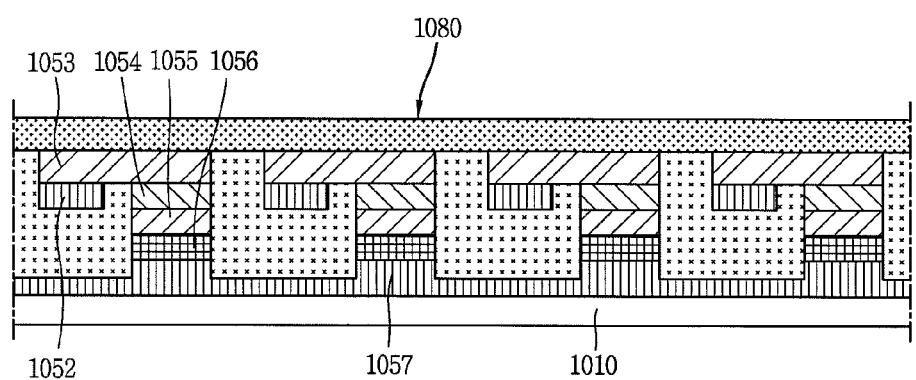
FIG. 14A is a cross-sectional view taken along line D-D in FIG. 13.
Figure 14B:
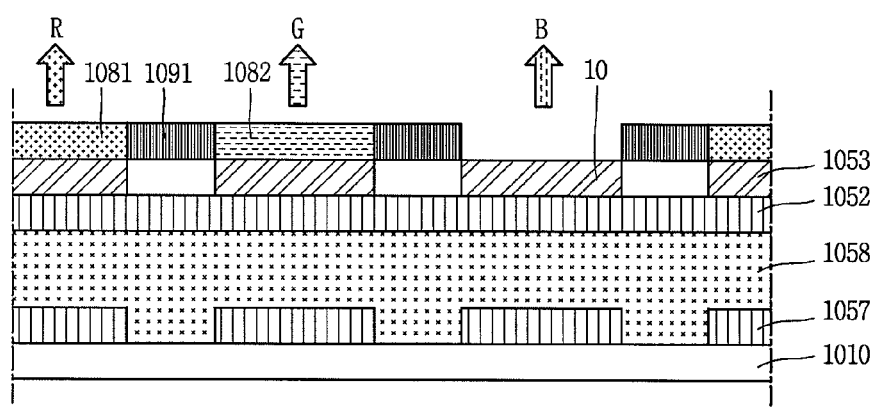
FIG. 14B is a cross-sectional view taken along line E-E in FIG. 13.

According to the drawings of FIGS. 13, 14A and 14B, there is illustrated a display device 1000 using a passive matrix (PM) type semiconductor light emitting device as the display device 1000 using a semiconductor light emitting device. However, the following illustration may be also applicable to an active matrix (AM) type semiconductor light emitting device.

The display device 1000 may include a supporting substrate 1010 mounted with a light emitting device array, and a first electrode 1052 and a second electrode 1057 are formed on the light emitting device array. Here, the first electrode 1052 and second electrode 1057 may include a plurality of electrode lines (first electrode lines and second electrode lines, refer to FIG. 10B), respectively. Furthermore, the first electrode 1052 and second electrode 1057 may perform the role of a data electrode and a scan electrode, respectively. However, the embodiment of the invention may not be necessarily limited to this, and the first electrode 1052 may be a scan electrode, and the second electrode 1057 may be a data electrode.

The supporting substrate 1010 as a substrate disposed with the second electrode 1057 may be formed of a flexible material. For example, the supporting substrate 1010 may include polyimide (PI) to implement a flexible display device. In addition, any material may be used if it is an insulating and flexible material. For another example, the supporting substrate 1010 may be formed of a rigid material with a high dissipation efficiency. In this instance, it may provide a solution to the dissipation problem in an application example requiring a high luminance.

More specifically, the light emitting device array may be coupled to the supporting substrate 1010 through an adhesive layer. In this instance, the adhesive layer may be formed by curing after coating of an adhesive agent, and the adhesive agent is coated to fill out between a plurality of semiconductor light emitting devices. Accordingly, the adhesive layer is formed to fill out a space existing between the plurality of semiconductor light emitting devices. Though the insulating layer 1058 is filled between semiconductor light emitting devices in a light emitting device array, there may exist a vacant space, and the adhesive layer completely fills out the vacant space.

Furthermore, the adhesive layer may be configured with a non-transparent layer to form a partition wall between the plurality of semiconductor light emitting devices. Through this, similarly to the insulating layer 1058, it has an effect of isolating a plurality of semiconductor light emitting devices even without additionally forming a partition wall.

For example, black or white is colored on the non-transparent layer. For a luminous efficiency, white may be colored thereon to perform the role of a reflector, and in order to minimize interference, black may be colored thereon to enhance the contrast of the semiconductor light emitting device. However, the embodiment of the invention may not be necessarily limited to this, and various colors may be applied to the non-transparent layer according to intention of the designer.

However, the embodiment of the invention may not be necessarily limited to a configuration in which a partition wall is formed by a combination of the insulating layer 1058 and the adhesive layer. In other words, the insulating layer 1058 or adhesive layer may form a partition wall by itself. For example, when the adhesive layer forms a partition wall by itself, it may be configured such that the insulating layer 1058 does not fill out between a plurality of semiconductor light emitting devices. On the contrary, when the insulating layer 1058 forms a partition wall by itself, it may be configured such that the adhesive layer does not fill out between a plurality of semiconductor light emitting devices.

According to the drawing, a plurality of semiconductor light emitting devices may form a plurality of columns in a direction parallel to the lines of the first electrode 1052. Furthermore, a plurality of semiconductor light emitting devices may form a plurality of columns along the lines of the second electrode 1057.

Moreover, the display device 1000 may further include a phosphor layer 1080 formed on one surface of a plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor 1081 or green phosphor 1082 constituting an individual pixel. In other words, the red phosphor 1081 capable of converting blue light into red (R) light may be deposited on the blue semiconductor light emitting device at a position constituting a red sub-pixel, and the green phosphor 1082 capable of converting blue light into green (G) light may be deposited on another blue semiconductor light emitting device at a position constituting a green sub-pixel. Furthermore, only a blue semiconductor light emitting device may be independently used at a portion constituting a blue sub-pixel. In this instance, the red (R), green (G) and blue (B) sub-pixels may be constituted on a pixel.

More specifically, one color phosphor may be deposited along each line of the second electrode 1057. Accordingly, one line on the second electrode 1057 may be an electrode controlling one color. In other words, red (R), green (G) and blue (B) may be sequentially disposed along the first electrode 1052, thereby implementing a sub-pixel. However, the embodiment of the invention may not be necessarily limited to this, and one color phosphor may be deposited along each line of the first electrode 1052, and thus red (R), green (G) and blue (B) may be sequentially disposed along the second electrode 1057.

Furthermore, instead of the phosphor, the semiconductor light emitting device semiconductor light emitting device 1050 and quantum dots (QDs) are combined to implement a sub-pixel emitting red (R), green (G) and blue (B).

On the other hand, a display device may further include a black matrix 1091 disposed between each phosphor to enhance the contrast of the phosphor layer 1080. The black matrix 1091 may be formed in such a manner that a gap is made between phosphor dots and a black material fills out the gap. Through this, the black matrix 1091 may enhance the contrast of luminance as well as absorbing external light reflection. The black matrix 1091 is located between each of phosphor layers along the second electrode 1057 which is a direction in which the phosphor layer 1080 is deposited. In this instance, a phosphor layer is not formed at a position corresponding to the blue semiconductor light emitting device 1051, but the black matrix may be formed at both sides, respectively, by interposing a space having no phosphor layer therebetween (or by interposing a blue semiconductor light emitting device therebetween).

According to embodiments of the invention, a wiring electrode may be formed on the light emitting device array itself to solve a problem for electrically connecting the wiring electrode to the semiconductor light emitting device, thereby implementing a higher definition display device.

The first electrode and second electrode may be connected to a connecting line for connecting a drive unit of the plurality of semiconductor light emitting devices while performing the role of a wiring electrode. In this instance, the connecting line may be provided on the supporting substrate.

Figure 15A:
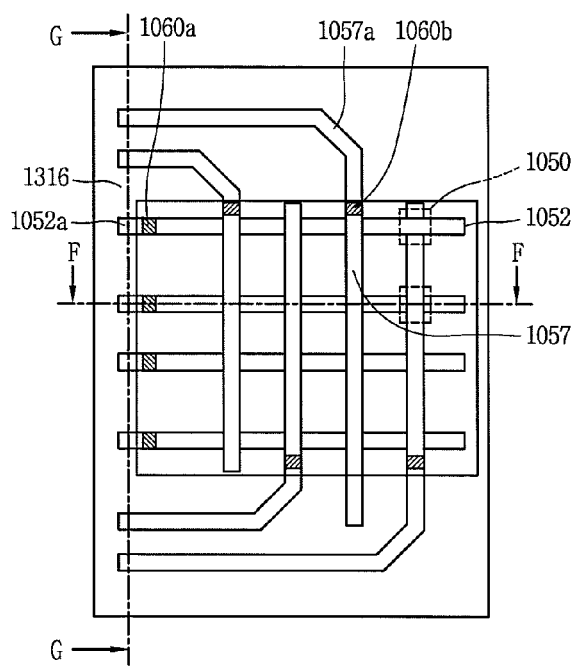
FIGS. 15A, 15B and 15C are conceptual views illustrating the wiring structure of a display device shown in FIG. 13.
Figure 15B:
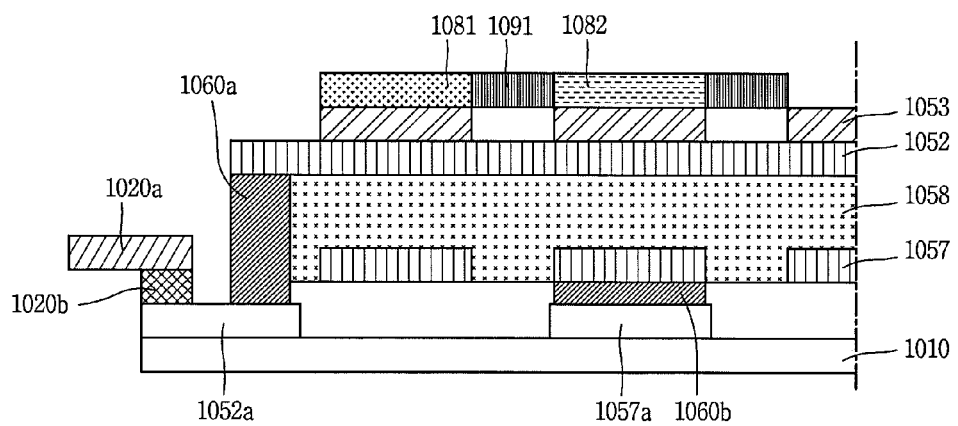
Figure 15C:
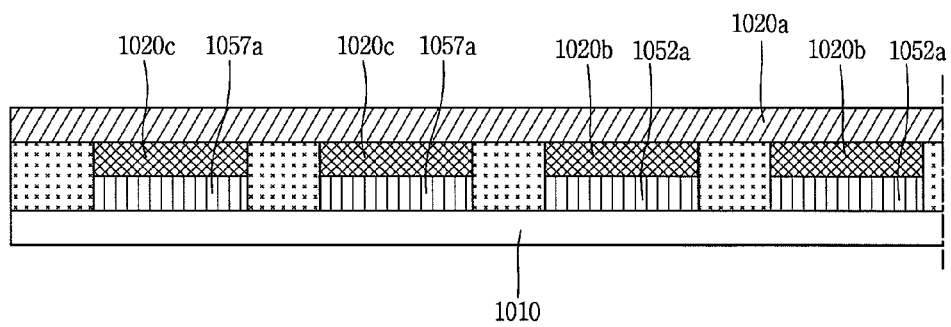

FIGS. 15A, 15B and 15C are conceptual views illustrating the wiring structure of a display device shown in FIG. 13.

Referring to the drawings, the first electrode 1052 and second electrode 1057 are formed in the directions crossed with each other on the supporting substrate 1010. Accordingly, the first electrode 1052 is formed with a first electrode line extended in a column of the light emitting device array, and the second electrode 1057 is provided with a second electrode line extended in a direction crossed with the first electrode line.

The first electrode line and second electrode line are electrically connected to a drive unit of the plurality of semiconductor light emitting devices, and to this end, the end portions of the first electrode line and second electrode line are disposed at an edge of the supporting substrate 1010. For example, the end portions of the first electrode line and second electrode line may be disposed adjacent to the sides of the light emitting device array crossed with each other, respectively.

In this instance, the drive unit may be a driving semiconductor chip, and mounted on a connection member 1020a in a chip-on-film (COF) package, and the first electrode line and second electrode line are connected to the connection member 1020a in a connection region 1316. In order to implement such a structure, the first electrode line and second electrode line are electrically connected to the connecting lines 1052a, 1057a of the supporting substrate, respectively, and either one of the connecting lines 1052a, 1057a is formed in a bent shape.

More specifically, the first electrode 1052 may be extended along a vertical direction, and the second electrode 1057 may be arranged in a horizontal direction. The second electrode 1057 is connected to a second connecting line 1057a at an end of the horizontal direction, and the second connecting line 1057a is bent and extended again in the vertical direction, thereby having a vertical portion. The end portions of the second connecting line 1057a are gathered in the connection region 1316 as extending the connection region 1316. Furthermore, according to the drawing, the horizontal portions of the second electrode 1057 may be disposed at the left and right sides of the substrate, respectively. Through such a structure, it may be possible to implement a finer wiring pattern. On the contrary, the first electrode 1052 may be connected to a first connecting line 1052a at an end of the vertical direction, thereby performing the role of extending the first electrode 1052 along the vertical direction.

However, the embodiment of the invention may not be necessarily limited to this, and for example, the second electrode 1057 may be covered by one surface of the supporting substrate, and connecting lines may be formed on the other surface of the supporting substrate. Here, a via hole may be formed on the supporting substrate to connect the first and the second electrode to the connecting lines. In this manner, the wiring structure for connecting a drive unit may not be necessarily limited to one type of embodiment, and modified into various forms.

According to the drawing, the first electrode 1052 and second electrode 1057 have a height difference according to a thickness direction of the semiconductor light emitting device. On the contrary, the connecting pads 1020b, 1020c of the connection member 1020a may include a first connecting pad 1020b and a second connecting pad 1020c with no height difference. The connecting lines 1052a, 1057a are formed on the same plane of the supporting substrate to correspond to the height of the first connecting pad 1020b and second connecting pad 1020c. A height difference between the first electrode 1052 and second electrode 1057 is solved by an electrical connection to the connecting lines 1052a, 1057a.

FIGS. 15B and 15C are cross-sectional views taken along line F-F and line G-G in FIG. 15A, respectively, and referring to the drawings, the connecting lines 1052a, 1057a are provided on the supporting substrate 1010, and thus the connection member 1020a is electrically connected to the supporting substrate 1010.

More specifically, according to the drawing, a metal layer 1060a, 1060b is disposed between an end portion of the connecting lines 1052a, 1057a and an end portion of the electrodes 1052, 1057. Here, the thicknesses of the metal layer 1060a, 1060n may be different from each other in the instance of the first connecting line 1052a and second connecting wire 1057a, thereby allowing the first connecting pad 1020b and second connecting pad 1020c of the connection member 1020a to have the same height. In other words, a first and a second metal layer 1060a, 1060n having different thicknesses are formed between the connecting lines 1052a, 1057a and the electrodes 1052, 1057.

In this instance, the metal layer 1060a, 1060b may be formed by a metal bonding (bump bonding). In the instance of the metal bonding (bump bonding), if a height for depositing a metal layer varies, then the connecting lines 1052a, 1057a are electrically connected to the electrodes 1052, 1057 in spite of the height difference. However, the embodiment of the invention may not be necessarily limited to this, and the metal layer may be also formed by other methods such as eutectic bonding or the like, for example.

Figure 16A:
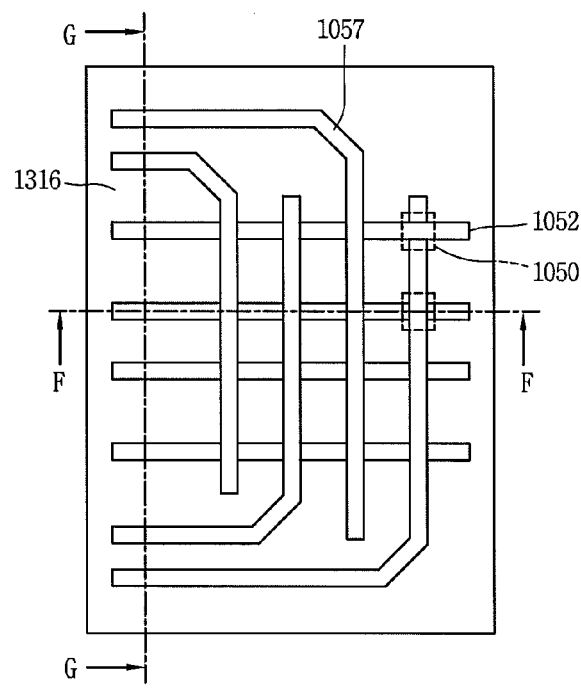
FIGS. 16A, 16B, 16C and 16D are conceptual views illustrating the wiring structure of a display device shown in FIG. 13.
Figure 16B:
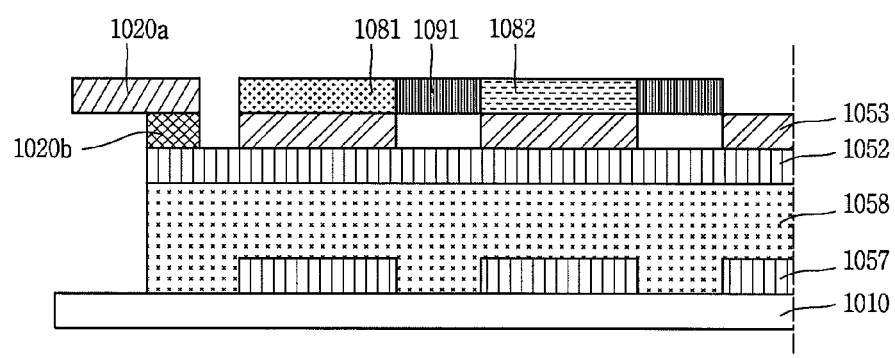
Figure 16C:
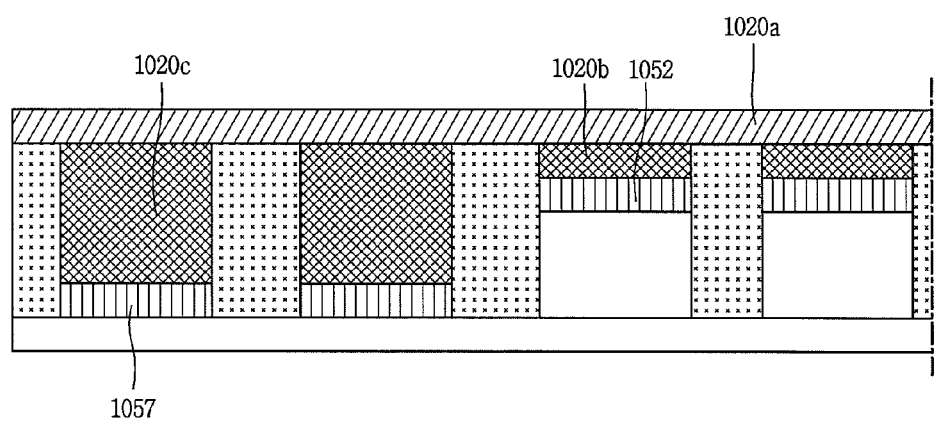

As described above, the connection structure for connecting a drive unit according to the embodiment of the invention has been described, but it may not be necessarily limited to one type of embodiment, and modified into various forms. In other words, all kinds of connection structures may be applicable to a display device according to the embodiment of the invention. For one of the examples, FIGS. 16A, 16B, 16C and 16D are conceptual views illustrating a new wiring structure, and FIGS. 16B and 16C are cross-sectional views taken along line F-F and line G-G in FIG. 16A, respectively.

According to the drawing, the first electrode and second electrode may be connecting lines for connecting a drive unit of the plurality of semiconductor light emitting devices. Here, the structure of the first electrode and second electrode performing the role of such connecting lines will be described with reference to the drawings.

Referring to the drawings, the first electrode 1052 and second electrode 1057 are formed in the directions crossed with each other on the supporting substrate 1010. Accordingly, the first electrode 1052 is formed with a first electrode line extended in a column of the light emitting device array, and the second electrode 1057 is provided with a second electrode line extended in a direction crossed with the first electrode line.

The first electrode line and second electrode line are electrically connected to a drive unit of the plurality of semiconductor light emitting devices, and to this end, the end portions of the first electrode line and second electrode line are disposed at an edge of the supporting substrate 1010. For example, the end portion of the first electrode line may be disposed adjacent to one side of the light emitting device array, and also the end portion of the second electrode line may be disposed adjacent to said one side thereof.

In this instance, the drive unit may be a driving semiconductor chip, and mounted on a connection member 1020a in a chip-on-film (COF) package, and the first electrode line and second electrode line are connected to the connection member 1020a in a connection region 1316. In order to implement such a structure, either one of the first electrode line and second electrode line may be formed in a bent shape.

More specifically, the first electrode 1052 may be extended along a vertical direction, and the second electrode 1057 may be arranged in a horizontal direction. The second electrode 1057 is bent at an end of the horizontal direction, and extended again in the vertical direction, thereby having a vertical portion. The end portions of the first electrode 1052 and second electrode 1057 are gathered in the connection region 1316 as extending the connection region 1316. Furthermore, according to the drawing, the vertical portion may be disposed at the left and right sides of the substrate, respectively. Through this structure, it may be possible to implement a finer wiring pattern.

For another example, the second electrode 1057 may have a structure having only a horizontal portion. In this instance, a portion (a vertical portion, and a portion for connecting the horizontal and vertical portions) extended from the horizontal portion on the second electrode 1057 may be formed on the supporting substrate.

According to the drawing, the first electrode 1052 and second electrode 1057 have a height difference according to a thickness direction of the semiconductor light emitting device. Accordingly, the connecting pads 1020*b*, 1020*c* of the connection member 1020*a* may include a first connecting pad 1020*b* and a second connecting pad 1020*c* with a height difference. The height of the second connecting pad 1020*c* is formed to be higher than that of the first connecting pad 1020*b*, and thus an electrical connection to the connection member 1020*a* is carried out in spite of a height difference between the first electrode 1052 and second electrode 1057.

For another example, a plurality of semiconductor light emitting devices are disposed to form a plurality of light emitting device arrays, and in this instance, a structure in which the plurality of light emitting device arrays are connected to one another may be taken into consideration.

Figure 16D:
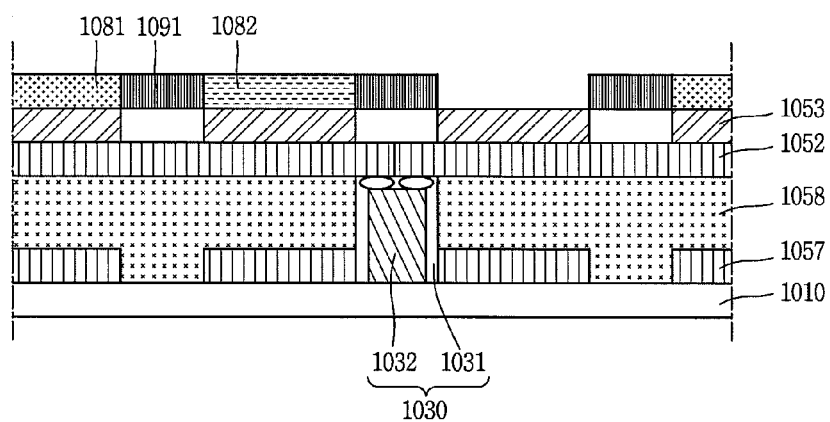

Referring to FIG. 16D, the light emitting device arrays may include the first electrodes 1052, respectively, and an electrical connection between the first electrodes 1052 to each other may be disconnected at an end portion of the light emitting device array. In this instance, the electrical connection between arrays may be implemented by a tiling technique.

For another example, it may be also possible to use a method in which a plurality of semiconductor light emitting devices implemented on one growth substrate form one light emitting device array, and a plurality of growth substrates are allowed to correspond to a single supporting substrate. For example, light emitting device arrays on a plurality of growth substrates are electrically connected to one another, and when the growth substrates are removed in a state that a single supporting substrate covers every growth substrate all at once, a large-area display device in which a plurality of light emitting device arrays are connected to one another is formed. In this instance, a plurality of light emitting device arrays, respectively, will be one display, and they may be combined with one another to implement a large-area display device.

Here, in order to implement an electrical connection between light emitting device arrays, a connecting portion 1030 for allowing adjoining light emitting device arrays to be electrically connected to one another may be formed on the supporting substrate 1010. For example, the connecting portion 1030 may include a conductive adhesive layer 1031 and a metal pad 1032.

The metal pad 1032 is disposed on one surface of the supporting substrate, and formed to be overlapped with the first electrodes of the adjoining light emitting device arrays, respectively, along a thickness direction of the display device.

The conductive adhesive layer 1031 is formed to electrically connect the first electrodes of the adjoining light emitting device arrays to the metal pad 1032.

For such an example, the conductive adhesive layer 1031 may be a solution containing an anisotropy conductive film (ACF), an anisotropic conductive paste and conductive particles. An electrical connection to the conductive adhesive layer in a display device described with reference to FIGS. 2, 3A and 3B may be applicable to an electrical connection between the conductive adhesive layer 1031 and metal pad 1032, and the description thereof will be substituted by the earlier description.

As described above, an instance in which a display device includes a blue semiconductor light emitting device emitting blue (B) light has been described, but the embodiment of the invention may not be necessarily limited to this, and another structure for implementing red, green and blue may be also applicable thereto.

Figure 17A:
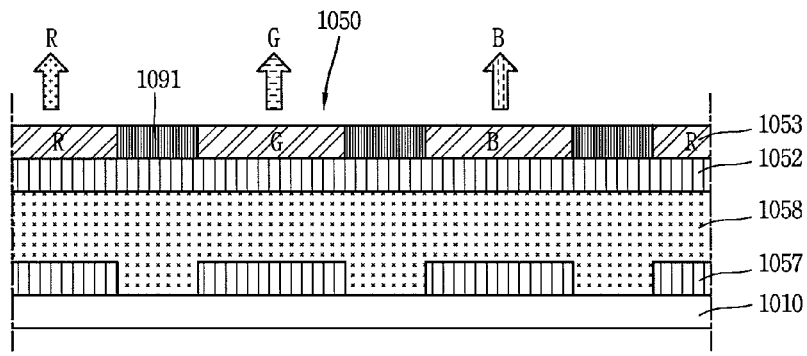
FIGS. 17A, 17B and 17C are conceptual views illustrating various forms for implementing color associated with a flip chip type semiconductor light emitting device with a new structure.
Figure 17B:
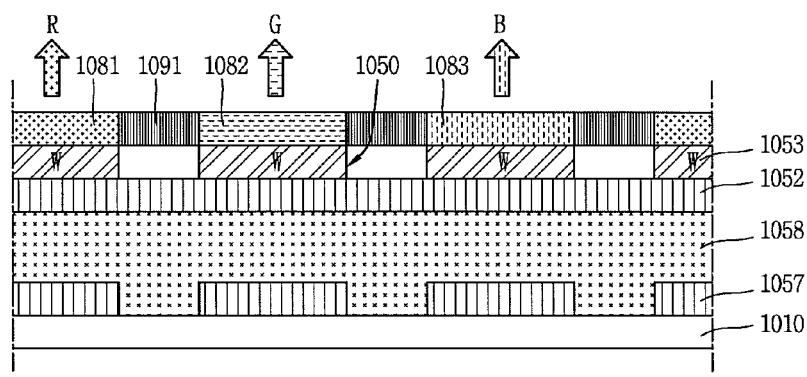
Figure 17C:
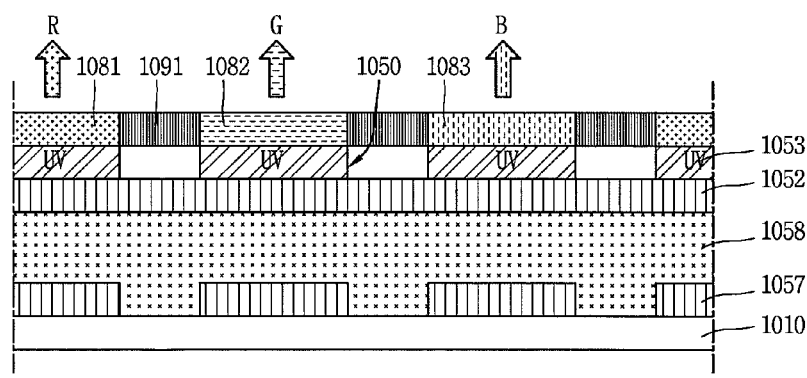

FIGS. 17A, 17B and 17C are conceptual views illustrating various forms for implementing color associated with a flip chip type semiconductor light emitting device with a new structure.

Referring to FIG. 17A, each semiconductor light emitting device 1050 may be implemented as a high power light emitting device that emits various light including blue in which gallium nitride (GaN) is mostly used, and indium (In) and/or aluminum (Al) are additionally used.

In this instance, the semiconductor light emitting device 1050 may be red, green and blue semiconductor light emitting devices to implement sub-pixels, respectively. For instance, red, green and blue semiconductor light emitting devices (R, G, B) are alternately disposed, and red, green and blue sub-pixels constitutes one pixel by the red, green and blue semiconductor light emitting devices, thereby implementing a full color display.

Even in this structure, similarly to the foregoing description, semiconductor light emitting devices may include the first electrode 1052 and second electrode 1057 electrically connected to adjoining semiconductor light emitting devices within the devices. For example, the first electrodes 1052 corresponding to the red, green and blue semiconductor light emitting devices (R, G, B), respectively, are electrically connected to one another. In this manner, the red, green and blue semiconductor light emitting devices (R, G, B) may be a semiconductor light emitting device with a new structure described with reference to FIGS. 10A and 10B, respectively.

In this manner, when the semiconductor light emitting devices independently implement R, G and B, an additional phosphor layer may not be provided therein. On the other hand, even in this instance, for contrast enhancement and external light reflection, a display device may further include a black matrix 1091 disposed between a plurality of columns configured with the semiconductor light emitting devices. As illustrated in the drawing, the black matrix 1091 may be disposed to be separated from each other in a horizontal direction.

For another example, referring to FIG. 17B, the semiconductor light emitting device may include a white light emitting device (W) provided with a yellow phosphor layer for each device. In this instance, the white output portion (W) has a structure that emits white light, and a phosphor layer may be formed on an upper surface of the white light emitting device (W). Furthermore, in order to accomplish a sub-pixel, a red phosphor layer 1081, a green phosphor layer 1082 and a blue phosphor layer 1083 may be provided on the white light emitting device (W).

Furthermore, the sub-pixel may be carried out using a color filter in which red, green and blue are repeated on the white light emitting device (W). Even in such a structure, similarly to the foregoing description, the white light emitting devices (Ws) may include the first electrode 1052 and second electrode 1057 electrically connected to the semiconductor light emitting device. In this manner, the white light emitting devices (Ws) may be a semiconductor light emitting device with a new structure described with reference to FIGS. 10A and 10B, respectively. The description of the foregoing structure will be substituted by the earlier description.

On the other hand, even in this instance, the display device 1000*a* may further include a black matrix 1091 disposed between a plurality of columns configured with semiconductor light emitting devices for contrast and external light reflection enhancement. The black matrix 1091 may be disposed between the red phosphor layer 1081, green phosphor layer 1082 and blue phosphor layer 1083.

For still another example, referring to FIG. 17C, it may be possible to have a structure in which the red phosphor layer 1081, green phosphor layer 1082 and blue phosphor layer 1083 are provided on an ultraviolet light emitting device (UV). In this manner, the semiconductor light emitting device may be used for the entire region including visible light as well as ultraviolet (UV), and may be extended to the form of a semiconductor light emitting device in which ultraviolet (UV) can be used as an excitation source of the upper phosphor.

Even in this structure, similarly to the foregoing description, the ultraviolet light emitting devices (UVs) may include the first electrode 1052 and second electrode 1057 electrically connected to an adjoining semiconductor light emitting device. In this manner, the ultraviolet light emitting device (UV) may be a semiconductor light emitting device with a new structure described with reference to FIGS. 10A and 10B, respectively. The description of the foregoing structure will be substituted by the earlier description.

On the other hand, even in this instance, the display device may further include a black matrix 1091 disposed between a plurality of columns configured with phosphors for contrast enhancement and external light reflection. The black matrix 1091 may be disposed between the red phosphor layer 1081, green phosphor layer 1082, and blue phosphor layer 1083.

As described above, an instance where the first electrode 1052 and second electrode 1057 are all formed with lines to connect adjoining semiconductor light emitting devices to one another, but the embodiment of the invention may not be necessarily limited to this, and a structure in which only either one of the first electrode 1052 and second electrode 1057 is formed with a line. Hereinafter, such a structure will be described with reference to the drawing.

Figure 18:
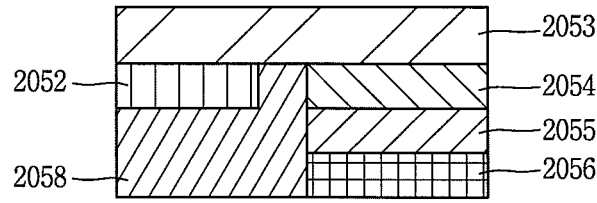
FIG. 18 is a conceptual view illustrating a semiconductor light emitting device with a new structure according to another embodiment.
Figure 19:
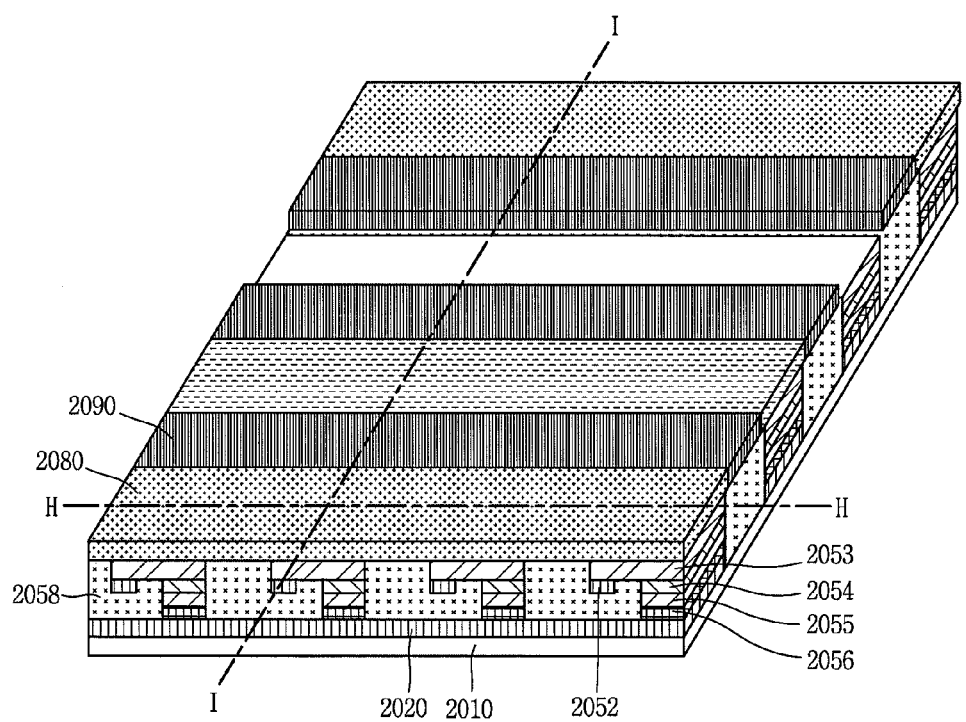
FIG. 19 is a partially enlarged view illustrating a display device to which a semiconductor light emitting device with a new structure shown in FIG. 18 is applied.
Figure 20A:
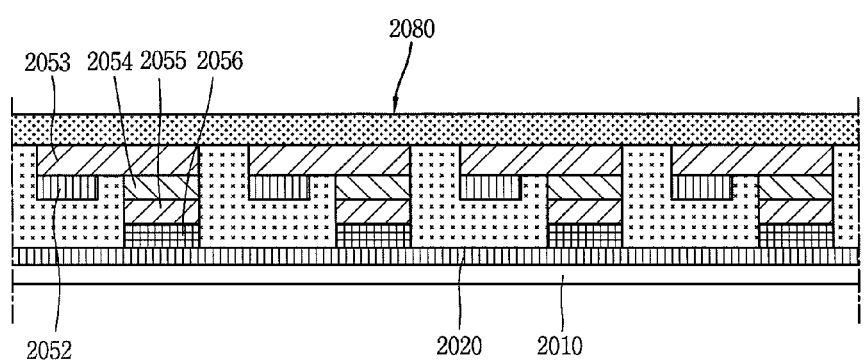
FIG. 20A is a cross-sectional view taken along line F-F in FIG. 19.
Figure 20B:
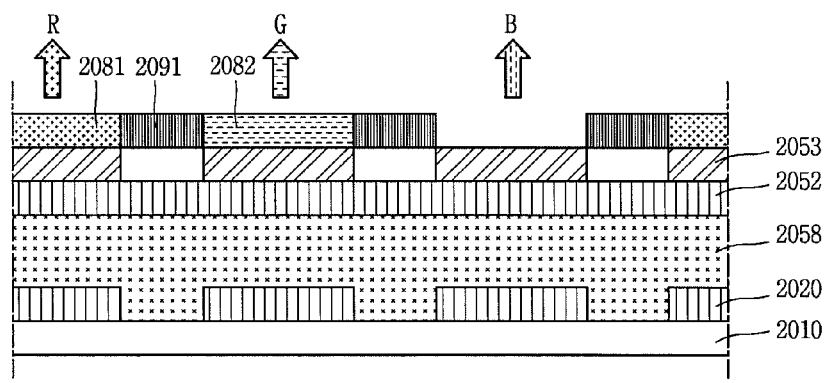
FIG. 20B is a cross-sectional view taken along line G-G in FIG. 19.

FIG. 18 is a conceptual view illustrating a semiconductor light emitting device with a new structure according to another embodiment, FIG. 19 is a partially enlarged view illustrating a display device to which a semiconductor light emitting device with a new structure shown in FIG. 18 is applied, and FIG. 20A is a cross-sectional view taken along line F-F in FIG. 19, and FIG. 20B is a cross-sectional view taken along line G-G in FIG. 19.

First, according to the drawing of FIG. 18, a semiconductor light emitting device 2050 may be a flip chip type light emitting device, and the semiconductor light emitting device 2050 may include a first conductive semiconductor layer 2053, a second conductive semiconductor layer 2055 overlapped with the first conductive semiconductor layer 2053, a first electrode 2052 formed on the first conductive semiconductor layer and a electrode pad (or third electrode 2056) deposited on the second conductive semiconductor layer 2055.

Moreover, according to the drawing, the semiconductor light emitting device 2050 may include an active layer 2054 formed between the first conductive semiconductor layer 2053 and the second conductive semiconductor layer 2055. Furthermore, the semiconductor light emitting device 2050 may further include an insulating layer 2058 formed to cover the active layer 2054 and electrode pad 2056 and the first electrode. Meanwhile, at least one of the first electrode 2052 and electrode pad 2056 may be formed with a transparent electrode. Compared to the semiconductor light emitting device in FIG. 10A, only the electrode pad 2056 may be configured on the semiconductor light emitting device without the second electrode. Meanwhile, the electrode pad 2056 may be formed within one surface of the second conductive semiconductor layer 2055, and thus the electrode pad 2056 may be arranged in a dot shape.

The first conductive semiconductor layer 2053 and the first electrode 2052 may be an "n-type semiconductor layer" and an "n-type electrode", respectively, and the second conductive semiconductor layer 2055 and the electrode pad 2056 may be a "p-type semiconductor layer" and a "p-type electrode", respectively. Accordingly, the electrode pad 2056 may have the same function and configuration as those of the p-type electrode in the illustration described with reference to FIGS. 2, 3A and 3B. Accordingly, an additional line for connecting the p-type electrode to a drive unit may be required, and it will be described later with reference to FIGS. 20A and 20B. Furthermore, even in this instance, for the n-type electrode, a wiring function is implemented within the semiconductor light emitting device.

More specifically, the first electrode 2052 and the active layer 2054 are formed on one surface of the first conductive semiconductor layer 2053, and disposed to be separated from each other by interposing the insulating layer 2058 therebetween. Here, one direction (horizontal direction) will be a width direction of the semiconductor light emitting device, and a vertical direction will be a thickness direction of the semiconductor light emitting device.

As illustrated in the drawing, the first electrode 2052 and the electrode pad 2056 are formed to have a height difference in a thickness direction perpendicular to said one direction at positions separated from each other in said one direction, respectively.

Moreover, according to the drawing, it is configured such that the first electrode 2052 is covered by one surface of the insulating layer 2058, and the electrode pad 2056 is not covered by the insulating layer 2058.

On the other hand, in a semiconductor light emitting device having the foregoing structure, the first electrode 2052 is extended toward adjoining semiconductor light emitting devices to be electrically connected to the adjoining semiconductor light emitting devices. Accordingly, the first electrode 2052 forms a first electrode line similarly to that illustrated in FIG. 10B.

A plurality of semiconductor light emitting devices are disposed to form a light emitting device array, and the first electrode 2052 may be configured with a first electrode line to electrically connect the plurality of semiconductor light emitting devices disposed in a column direction. In this manner, a plurality of semiconductor light emitting devices disposed at each column of the light emitting device array share the first electrode 2052. In other words, the first electrode 2052 as an electrode formed on one surface of the first conductive semiconductor layer 2053 electrically connects a plurality of semiconductor light emitting devices included in the same column. In this manner, the first electrode 2052 connecting a plurality of semiconductor light emitting devices disposed along a column direction may perform the role of a scan electrode in the display device 2000 according to the embodiment of the invention. The first electrode 2052 may be an n-type electrode of the semiconductor light emitting device as well as a scan electrode of the display device 2000.

According to the drawings in FIGS. 19, 20A and 20B, the display device 2000 may include a supporting substrate 2010 mounted with a light emitting device array, and the first electrode 2052 and electrode pad 2056 are formed on the light emitting device array, and a second electrode line 2020 is provided on the supporting substrate 2010. In this manner, according to the embodiments of the invention, in an instance of the second electrode, the electrode pad 2056 is implemented in a semiconductor light emitting device, and the second electrode line 2020 is implemented on the supporting substrate. The second electrode line 2020 performs the function of a connecting line, and thus the supporting substrate performs the function of a wiring substrate with respect to the second electrode 2057.

The second electrode line 2020 is electrically connected to the electrode pad 2056 included in semiconductor light emitting devices, and extended in a row direction crossed with a column direction in which the first electrode 2052 (or first electrode line) is disposed in the semiconductor light emitting device array.

The second electrode line 2020 as an electrode electrically connected to the second conductive semiconductor layer 2055 through the electrode pad 2056 electrically connects a plurality of semiconductor light emitting device included in the same row. In this manner, the second electrode 2057 for electrically connecting a plurality of semiconductor light emitting device disposed along a row direction may perform the role of a data electrode in the display device 2000 according to the embodiment of the invention.

On the other hand, a plurality of semiconductor light emitting devices forming a light emitting device array may be disposed to be separated from one another by interposing a predetermined space to adjoining light emitting devices, wherein the insulating layer 2058 may be filled between the semiconductor light emitting devices separately disposed therein. In other words, the insulating layer 2058 may be disposed between the semiconductor light emitting devices to perform the role of a partition wall. The insulating layer 2058 includes an insulator, and may be formed with the black insulator or white insulator. Moreover, the insulator may be formed of a resin, and the black or white insulator may be implemented by coloring the resin.

On the other hand, when the insulating layer 2058 is formed with a black insulator, the insulating layer 2058 may enhance the contrast of the semiconductor light emitting device as well as insulating the first electrode 2052 and electrode pad 2056. Moreover, when the insulating layer 2058 is formed with a white insulator, the insulating layer 2058 performs the role of a reflector as well as insulating the first and the first electrode 2052 and electrode pad 2056.

The supporting substrate 2010 may be formed of a flexible material. For example, the supporting substrate 2010 may include polyimide (PI) to implement a flexible display device. In addition, any material may be used if it is an insulating and flexible material. For another example, the supporting substrate 2010 may be formed of a rigid material with a high dissipation efficiency. In this instance, it may provide a solution to the dissipation problem in an application example requiring a high luminance.

An adhesive layer may be disposed between the light emitting device array and the supporting substrate 2010 to couple the second electrode line 2020 to the electrode pad 2056.

In this instance, the adhesive layer may be a conductive adhesive layer illustrated in a display device described with reference to FIGS. 2, 3A and 3B. Accordingly, the conductive adhesive layer may be a solution containing an anisotropy conductive film (ACF), an anisotropic conductive paste and conductive particles.

Furthermore, black or white may be colored on the conductive adhesive layer. For a luminous efficiency, white may be colored thereon to perform the role of a reflector, and in order to minimize interference, black may be colored thereon to enhance the contrast of the semiconductor light emitting device. However, the embodiment of the invention may not be necessarily limited to this, and various colors may be applied to the non-transparent layer according to intention of the designer.

Moreover, the display device 2000 may further include a phosphor layer 2080 formed on one surface of a plurality of semiconductor light emitting devices 2050. For example, the semiconductor light emitting device 2050 is a blue semiconductor light emitting device that emits blue (B) light, and the phosphor layer 2080 performs the role of converting the blue (B) light into the color of a sub-pixel. The phosphor layer 2080 may be a red phosphor 2081 or green phosphor 2082 constituting an individual pixel. In other words, the red phosphor 2081 capable of converting blue light into red (R) light may be deposited on the blue semiconductor light emitting device at a position constituting a red sub-pixel, and the green phosphor 2082 capable of converting blue light into green (G) light may be deposited on another blue semiconductor light emitting device at a position constituting a green sub-pixel. Furthermore, only a blue semiconductor light emitting device may be independently used at a portion constituting a blue sub-pixel. In this instance, the red (R), green (G) and blue (B) sub-pixels may be constituted on a pixel. However, the embodiment of the invention may not be necessarily limited to this, and instead of the phosphor, the semiconductor light emitting device semiconductor light emitting device 2050 and quantum dots (QDs) are combined to implement a sub-pixel emitting red (R), green (G) and blue (B).

On the other hand, a display device may further include a black matrix 2091 disposed between each phosphor to enhance the contrast of the phosphor layer 2080. The black matrix 2091 may be formed in such a manner that a gap is made between phosphor dots and a black material fills out the gap. Through this, the black matrix 2091 may enhance the contrast of luminance as well as absorbing external light reflection.

According to the embodiments of the invention, part of the wiring electrode may be formed from the light emitting device array itself, thereby solving part of the problem of electrically connecting the wiring electrode with the semiconductor light emitting device.

The first electrode performs the role of a wiring electrode, and thus the first electrode and second electrode may be connecting lines for connecting a drive unit of the plurality of semiconductor light emitting devices. Hereinafter, structures described in FIGS. 15A, 15B, 15C or FIGS. 16A, 16B, 16C and 16D may be applicable to the structure of the first electrode and second electrode performing the role of the connecting lines, and the description thereof will be substituted by the earlier description.

The configurations and methods according to the above-described embodiments will not be applicable in a limited way to the foregoing display device using a semiconductor light emitting device, and all or part of each embodiment may be selectively combined and configured to make various modifications thereto.

According to the embodiment of the invention having the foregoing configuration, the fabrication process and wiring process of a semiconductor light emitting device can be unified.

In this manner, according to the embodiment of the invention, an electrode corresponding to a wiring electrode may be provided on a semiconductor light emitting device itself, thereby reducing a wiring process that has been carried out on a supporting substrate to electrically connect the semiconductor light emitting device to a drive unit.

Furthermore, according to the embodiment of the invention, a wiring electrode may be provided on a semiconductor light emitting device itself, thereby implementing a high definition display device with no restriction of fine pitch.

What is claimed is:

1. A display device comprising a plurality of semiconductor light emitting devices, wherein each of the plurality of semiconductor light emitting devices comprises:
   an n-type semiconductor layer;
   a p-type semiconductor layer overlapped with the n-type semiconductor layer;
   an active layer disposed between the n-type semiconductor layer and the p-type semiconductor layer;
   an n-type electrode deposited on the n-type semiconductor layer; and
   a p-type electrode deposited on the p-type semiconductor layer,
   wherein the n-type electrode is formed as an electrode line extending toward an adjoining semiconductor light emitting device to be electrically connected to the adjoining semiconductor light emitting device, and
   wherein the electrode line is overlapped with one surface of an n-type semiconductor layer of the adjoining semiconductor light emitting device.

2. The display device of claim 1, wherein the plurality of semiconductor light emitting devices further comprises an insulating layer formed to cover the n-type electrode.

3. The display device of claim 2, wherein the insulating layer comprises a black or white insulator.

4. The display device of claim 1, wherein the plurality of semiconductor light emitting devices are disposed to form a light emitting device array, and
   n-type electrodes of the plurality of semiconductor light emitting devices connect to form a first electrode line extended along a column of the light emitting device array, and p-type electrodes of the plurality of semiconductor light emitting device connect to form a second electrode line extended in a direction crossed with the first electrode line.

5. The display device of claim 4, wherein the first electrode line and second electrode line are electrically connected to a drive unit of the plurality of semiconductor light emitting devices.

6. The display device of claim 5, wherein an end portion of the first electrode line is disposed adjacent to one side of the light emitting device array.

7. The display device of claim 6, wherein either one of the first electrode line and second electrode line is formed in a bent shape such that an end portion of the p-type electrode is disposed adjacent to the one side of the light emitting device array.

8. The display device of claim 4, wherein the first electrode line is covered by one surface of an insulating layer, and
   the second electrode line is formed to cover the other surface of the insulating layer.

9. The display device of claim 4, wherein the first electrode line is disposed on one surface of the n-type semiconductor layer.

10. The display device of claim 1, wherein an electrode pad is disposed between the p-type electrode and the p-type semiconductor layer.

11. The display device of claim 1, wherein at least one of the n-type and the p-type electrode is a transparent electrode.

12. The display device of claim 1, wherein the plurality of semiconductor light emitting devices are coupled to a supporting substrate through an adhesive layer.

13. The display device of claim 12, wherein the adhesive layer is formed to fill out a space existing between the plurality of semiconductor light emitting devices.

14. The display device of claim 12, wherein a connecting line connected to at least one of the n-type electrode and p-type electrode, and extended toward a connection region provided on the supporting substrate is formed on the supporting substrate.

15. The display device of claim 14, wherein the connection line includes a first connecting line connected to the n-type electrode and a second connecting line connected to the p-type electrode,
   a metal layer has a first portion and a second portion of different thicknesses, and
   the first portion is disposed between the n-type electrode and the first connecting line, and the second portion is disposed between the p-type electrode and the second connecting line such that the first connecting line and the second connecting line are located on the same surface of the supporting substrate.

16. The display device of claim 12, wherein the supporting substrate is formed of a flexible material.

17. The display device of claim 12, wherein the plurality of semiconductor light emitting devices are disposed to form a plurality of light emitting device arrays, and a connecting portion for electrically connecting the adjoining light emitting device arrays to one another is formed on the supporting substrate.

18. The display device of claim 12, wherein n-type electrodes of the plurality of semiconductor light emitting devices form a first electrode line, p-type electrodes of the plurality of light emitting devices form a second electrode line, and the second electrode line is disposed on the supporting substrate.

19. The display device of claim 1, wherein each of the plurality of semiconductor light emitting devices emits light of at least one of red light, green light, blue light and ultraviolet light.

20. The display device of claim 1, further comprising a phosphor layer to convert a predetermined light into at least one of red light, green light and blue light.

21. A display device comprising a plurality of semiconductor light emitting devices, wherein each of the plurality of semiconductor light emitting devices comprises:
   an n-type semiconductor layer;
   a p-type semiconductor layer overlapped with the n-type semiconductor layer;
   an active layer disposed between the n-type semiconductor layer and the p-type semiconductor layer;
   an n-type electrode deposited on the n-type semiconductor layer;
   a p-type electrode deposited on the p-type semiconductor layer; and an insulating layer, wherein at least a portion of the insulating layer is disposed between the n-type electrode and the p-type electrode, wherein the n-type electrode is formed as an electrode line extending toward an adjoining semiconductor light emitting device to be electrically connected to the adjoining semiconductor light emitting device, and wherein the electrode line is overlapped with one surface of an n-type semiconductor layer of the adjoining semiconductor light emitting device.

22. The display device of 21, wherein the insulating layer covers the n-type electrode.

23. The display device of claim 21, wherein the insulating layer covers a portion of the n-type semiconductor layer.

* * * * *